(12) United States Patent
Kobayashi et al.

(10) Patent No.: US 12,402,496 B2
(45) Date of Patent: Aug. 26, 2025

(54) DISPLAY DEVICE

(71) Applicant: Semiconductor Energy Laboratory Co., Ltd., Atsugi (JP)

(72) Inventors: Hidetomo Kobayashi, Isehara (JP); Hideaki Shishido, Atsugi (JP); Shuichi Katsui, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 615 days.

(21) Appl. No.: 17/555,671

(22) Filed: Dec. 20, 2021

(65) Prior Publication Data

US 2022/0208939 A1 Jun. 30, 2022

(30) Foreign Application Priority Data

Dec. 24, 2020 (JP) ................................ 2020-214950
Sep. 28, 2021 (JP) ................................ 2021-158140

(51) Int. Cl.
*H01L 27/32* (2006.01)
*H10D 30/67* (2025.01)
*H10K 59/131* (2023.01)

(52) U.S. Cl.
CPC ....... *H10K 59/131* (2023.02); *H10D 30/6713* (2025.01); *H10D 30/6743* (2025.01); *H10D 30/6757* (2025.01)

(58) Field of Classification Search
None
See application file for complete search history.

(56) References Cited

U.S. PATENT DOCUMENTS

| | | | |
|---|---|---|---|
| 6,462,723 B1 | 10/2002 | Yamazaki et al. | |
| 6,952,023 B2 * | 10/2005 | Yamazaki ........... | H01L 27/1288 257/E29.283 |
| 7,199,768 B2 | 4/2007 | Ono et al. | |
| 7,317,429 B2 | 1/2008 | Shirasaki et al. | |
| 7,369,075 B2 | 5/2008 | Ishii et al. | |
| 7,674,650 B2 | 3/2010 | Akimoto et al. | |
| 8,067,775 B2 | 11/2011 | Miyairi et al. | |
| 8,106,400 B2 | 1/2012 | Miyairi et al. | |
| 8,212,488 B2 | 7/2012 | Osame et al. | |
| 8,737,109 B2 | 5/2014 | Yamazaki et al. | |
| 9,047,836 B2 | 6/2015 | Koyama | |
| 9,536,904 B2 | 1/2017 | Miyake et al. | |
| 2002/0113546 A1 | 8/2002 | Seo et al. | |

(Continued)

FOREIGN PATENT DOCUMENTS

JP 2002-324673 A 11/2002
JP 4429576 * 3/2010

*Primary Examiner* — Long Pham
(74) *Attorney, Agent, or Firm* — Eric J. Robinson; Robinson Intellectual Property Law Office, P.C.

(57) ABSTRACT

A display device with high resolution is provided. A display device with low power consumption is provided. A display device with high luminance is provided. A display device with a high aperture ratio is provided. The display device includes a first wiring, a second wiring, a third wiring, and a pixel electrode. The first wiring extends in a first direction and is supplied with a source signal. The second wiring extends in a second direction intersecting the first direction and is supplied with a gate signal. The third wiring is supplied with a constant potential. The first wiring and the pixel electrode overlap with each other with the third wiring therebetween.

19 Claims, 29 Drawing Sheets

(56) References Cited

U.S. PATENT DOCUMENTS

| | | |
|---|---|---|
| 2005/0030265 A1 | 2/2005 | Miyagawa |
| 2008/0225061 A1 | 9/2008 | Kimura et al. |
| 2010/0032679 A1 | 2/2010 | Kawae et al. |
| 2010/0096654 A1 | 4/2010 | Godo |
| 2010/0117072 A1 | 5/2010 | Ofuji et al. |
| 2011/0031496 A1 | 2/2011 | Yamazaki et al. |
| 2011/0031499 A1* | 2/2011 | Kimura ............... H01L 27/1251 257/E29.296 |
| 2011/0057187 A1 | 3/2011 | Sakakura et al. |
| 2011/0062434 A1 | 3/2011 | Eguchi et al. |
| 2011/0108837 A1 | 5/2011 | Yamazaki et al. |
| 2011/0133181 A1 | 6/2011 | Yamazaki |
| 2011/0210324 A1 | 9/2011 | Sakakura et al. |
| 2011/0210355 A1 | 9/2011 | Yamazaki et al. |
| 2012/0007084 A1 | 1/2012 | Park et al. |
| 2013/0021316 A1 | 1/2013 | Inoue et al. |
| 2013/0063413 A1 | 3/2013 | Miyake |
| 2013/0069068 A1 | 3/2013 | Miyake |
| 2013/0207102 A1 | 8/2013 | Miyake et al. |
| 2014/0168194 A1 | 6/2014 | Kong et al. |
| 2015/0171156 A1 | 6/2015 | Miyake |
| 2015/0187276 A1 | 7/2015 | Shim et al. |
| 2016/0260373 A1 | 9/2016 | Miyake |
| 2016/0300900 A1 | 10/2016 | Miyake |
| 2016/0329392 A1 | 11/2016 | Miyake |

\* cited by examiner

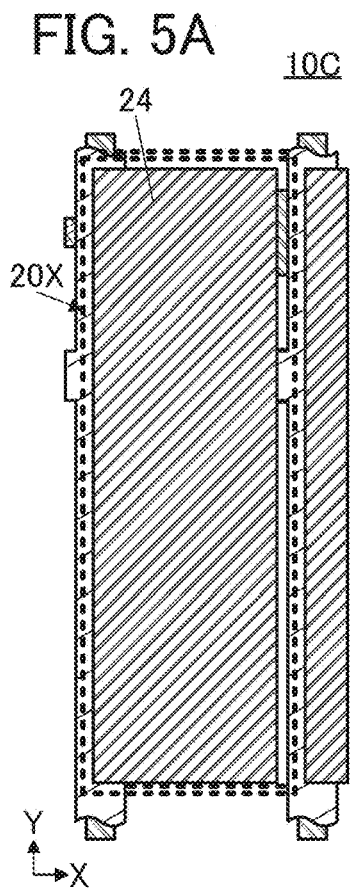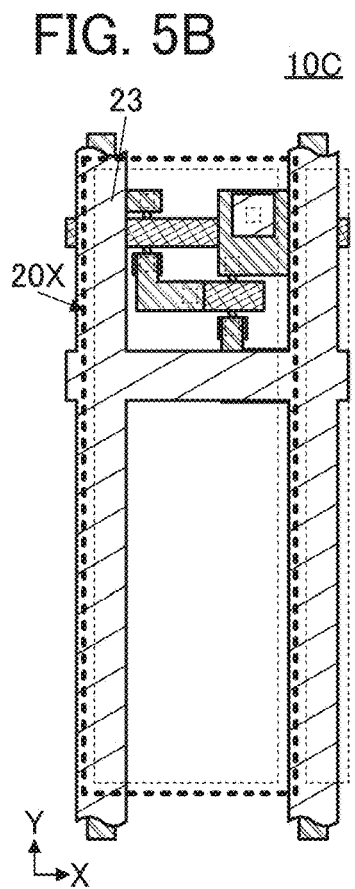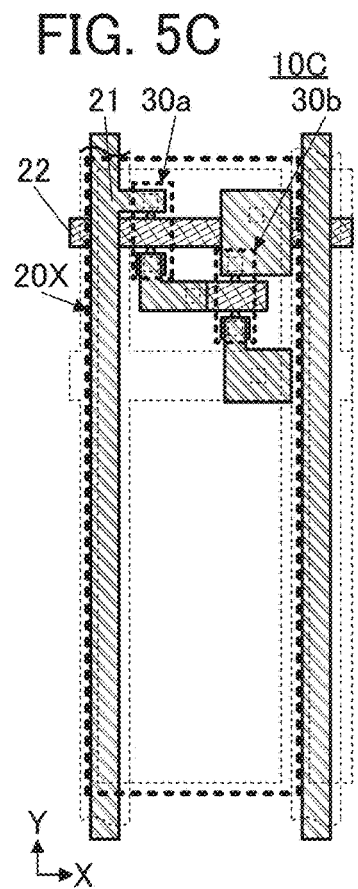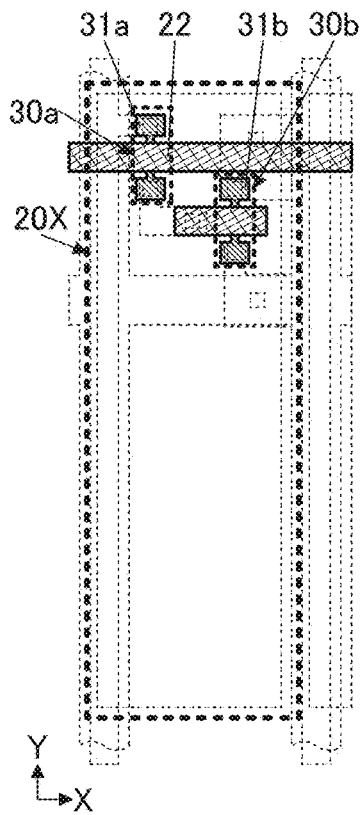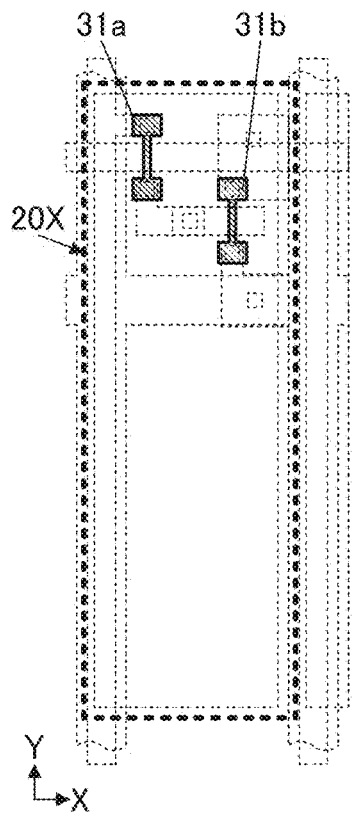

DISPLAY DEVICE

BACKGROUND OF THE INVENTION

1. Field of the Invention

One embodiment of the present invention relates to a display device. One embodiment of the present invention relates to an electronic device including a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to a device that can function by utilizing semiconductor characteristics in general.

2. Description of the Related Art

In recent years, the resolution of a display panel has been increased. As a device that requires a high-resolution display panel, a device for virtual reality (VR) or augmented reality (AR) has been actively developed in recent years.

Examples of the display device that can be used for a display panel include, typically, a liquid crystal display device, a light-emitting apparatus including a light-emitting element such as an organic electroluminescent (EL) element or a light-emitting diode (LED), and electronic paper performing display by an electrophoretic method or the like.

An organic EL element generally has a structure in which a layer containing a light-emitting organic compound is provided between a pair of electrodes. By voltage application to this element, the light-emitting organic compound can emit light. A display device including such an organic EL element needs no backlight which is necessary for a liquid crystal display device and the like and thus can have advantages such as thin, lightweight, high contrast, and low power consumption. Patent Document 1, for example, discloses an example of a display device using an organic EL element.

REFERENCE

[Patent Document 1] Japanese Published Patent Application No. 2002-324673

SUMMARY OF THE INVENTION

The above-described wearable device for VR or AR needs to be provided with a focus adjustment lens between eyes and the display panel. Since part of the screen is enlarged by the lens, low resolution of the display panel might cause a problem of weak sense of reality and immersion.

In addition, in the case of a battery-driven device, the power consumption of the display panel needs to be reduced in order that the continuous use time can be prolonged. In particular, a transmissive type device for AR is required to have high luminance because an image is displayed to be overlaid on external light.

An object of one embodiment of the present invention is to provide a display device with high resolution. An object of one embodiment of the present invention is to provide a display device with low power consumption. An object of one embodiment of the present invention is to provide a display device with high luminance. An object of one embodiment of the present invention is to provide a display device with a high aperture ratio. An object of one embodiment of the present invention is to provide a highly reliable display device.

An object of one embodiment of the present invention is to provide a novel display device, a novel display module, or a novel electronic device. An object of one embodiment of the present invention is to provide a method for manufacturing the display device with high yield. An object of one embodiment of the present invention is to reduce at least one of problems of the conventional technique.

Note that the description of these objects does not preclude the existence of other objects. In one embodiment of the present invention, there is no need to achieve all these objects. Objects other than these can be derived from the description of the specification, the drawings, the claims, and the like.

One embodiment of the present invention is a display device including a first wiring, a second wiring, a third wiring, and a pixel electrode. The first wiring extends in a first direction and is supplied with a source signal. The second wiring extends in a second direction intersecting the first direction and is supplied with a gate signal. The third wiring is supplied with a constant potential. The first wiring and the pixel electrode overlap with each other with the third wiring therebetween.

Another embodiment of the present invention is a display device including a first wiring, a second wiring, a third wiring, a pixel electrode, a first transistor, and a second transistor. The first wiring extends in a first direction and is supplied with a source signal. The second wiring extends in a second direction intersecting the first direction and is supplied with a gate signal. The third wiring is supplied with a first potential. The first wiring and the pixel electrode overlap with each other with the third wiring therebetween. One of a source and a drain of the first transistor is electrically connected to the first wiring and a gate of the first transistor is electrically connected to the second wiring. One of a source and a drain of the second transistor is electrically connected to the pixel electrode and the other of the source and the drain of the second transistor is electrically connected to the third wiring. The first transistor and the second transistor each include a semiconductor layer in which current flows in the first direction.

Another embodiment of the present invention is a display device including a first wiring, a second wiring, a third wiring, a pixel electrode, a first transistor, and a second transistor. The first wiring extends in a first direction and is supplied with a source signal. The second wiring extends in a second direction intersecting the first direction and is supplied with a gate signal. The third wiring is supplied with a first potential. The first wiring and the pixel electrode overlap with each other with the third wiring therebetween. One of a source and a drain of the first transistor is electrically connected to the first wiring and a gate of the first transistor is electrically connected to the second wiring. One of a source and a drain of the second transistor is electrically connected to the pixel electrode and the other of the source and the drain of the second transistor is electrically connected to the third wiring. The first transistor and the second transistor each comprise a semiconductor layer in which current flows in the second direction.

In the above embodiment, a plurality of dummy layers is preferably included. At this time, it is preferable that the dummy layers each include the same semiconductor material as the semiconductor layer and each include a portion having substantially the same top surface shape as the semiconductor layer. Furthermore, it is preferable that the plurality of dummy layers and the semiconductor layer be arranged at a regular interval in the second direction or the first direction.

In any of the above embodiments, a fourth wiring, a third transistor, and a fourth transistor are preferably included. One of a source and a drain of the third transistor is electrically connected to the fourth wiring and the other of the source and the drain of the third transistor is electrically connected to a gate of the second transistor. One of a source and a drain of the fourth transistor is electrically connected to the fourth wiring and the other of the source and the drain of the fourth transistor is electrically connected to the pixel electrode. The fourth wiring is supplied with a second potential lower than the first potential In any of the above embodiments, a fifth transistor is preferably included. The fifth transistor is a transistor in which a channel is formed in silicon. The semiconductor layer contains one or both of indium and zinc. The first transistor and the second transistor are preferably provided above the fifth transistor.

In any of the above embodiments, the third wiring preferably has a top surface shape in a form of lattice. At this time, a first portion extending in the first direction and a second portion extending in the second direction are preferably included. Furthermore, it is preferably that the pixel electrode and the first wiring overlap with each other with the first portion therebetween.

In any of the above embodiments, the number of pixel electrodes is preferably two or more. A light-emitting region is provided over the pixel electrode. The light-emitting regions are arranged so that one of the light-emitting regions is surrounded by six of the light-emitting regions in a plan view.

In the above embodiment, the light-emitting region preferably has a substantially hexagonal top surface shape. Furthermore, it is preferable that the light-emitting region have a top surface shape in which interior angles of two opposite corners of six corners are each larger than 120° and interior angles of the other four of the six corners are each smaller than 120°.

Alternatively, in the above embodiment, the light-emitting region preferably has a substantially hexagonal top surface shape. Furthermore, it is preferable that the pixel electrode have a top surface shape in which six angles are each 120°, lengths of two opposite sides of six sides are equal to each other, and lengths of the other four sides are equal to one another.

In any of the above embodiments, three adjacent light-emitting regions of the light-emitting regions are preferably positioned to be on vertices of an isosceles triangle.

Another embodiment of the present invention is a display module including any of the display devices, and a connector or an integrated circuit.

Another embodiment of the present invention is an electronic device including the above-described display module and at least one of an antenna, a battery, a housing, a camera, a speaker, a microphone, a touch sensor, and an operation button.

According to one embodiment of the present invention, a display device with high resolution can be provided. A display device with low power consumption can be provided. A display device with high luminance can be provided. A display device with a high aperture ratio can be provided. A highly reliable display device can be provided.

According to one embodiment of the present invention, a novel display device, a novel display module, a novel electronic device, or the like can be provided. A method for manufacturing the display device with high yield can be provided. At least one of problems of the conventional technique can be reduced.

Note that the description of these effects does not preclude the existence of other effects. One embodiment of the present invention does not necessarily have all these effects. Effects other than these can be derived from the description of the specification, the drawings, the claims, and the like.

BRIEF DESCRIPTION OF THE DRAWINGS

In the accompanying drawings:

FIGS. 5A to 5E each illustrate a structure example of a display device;

DETAILED DESCRIPTION OF THE INVENTION

Figure 1A:
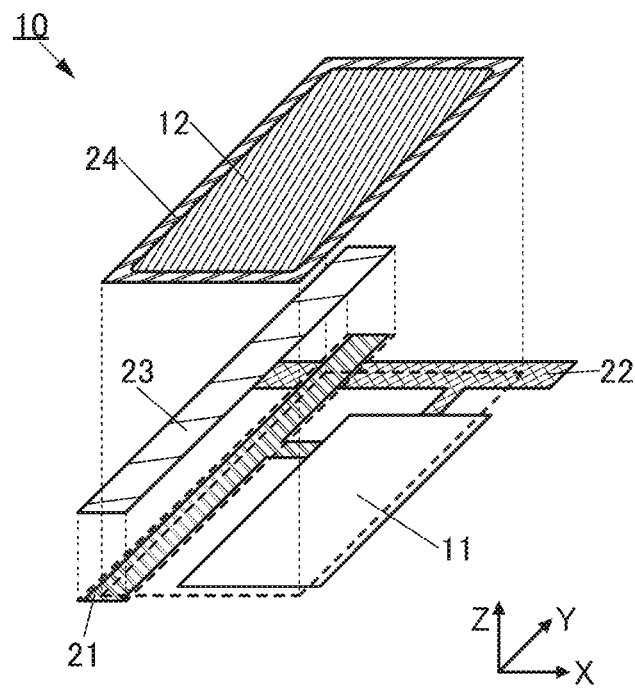
FIGS. 1A to 1C each illustrate a structure example of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

Note that in this specification and the like, the expression "having substantially the same top surface shapes" means that at least outlines of stacked layers partly overlap with each other. For example, the case of patterning an upper layer and a lower layer with the use of the same or partially the same mask patterns is included in the expression. The expression "having substantially the same top surface shapes" also sometimes includes the case where the outlines do not completely overlap with each other; for instance, the edge of the upper layer may be positioned on the inner side or the outer side of the edge of the lower layer.

Note that the expressions indicating directions such as "over" and "under" are basically used to correspond to the directions of drawings. However, in some cases, the term "over" or "under" in the specification indicates a direction that does not correspond to the apparent direction in the drawings, for the purpose of easy description or the like. For example, when a stacked order (formation order) of a stacked body or the like is described, even in the case where a surface on which the stacked body is provided (e.g., a formation surface, a support surface, a bonding surface, or a planarization surface) is positioned above the stacked body in the drawings, the direction and the opposite direction are referred to as "under" and "over", respectively, in some cases.

Note that in this specification, an EL layer means a layer containing at least a light-emitting substance (also referred to as a light-emitting layer) or a stack including the light-emitting layer provided between a pair of electrodes of a light-emitting element.

In this specification and the like, a display panel that is one embodiment of a display device has a function of displaying (outputting) an image or the like on (to) a display surface. Thus, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

Embodiment 1

In this embodiment, a structure example of a display device of one embodiment of the present invention will be described.

One embodiment of the present invention is a display device that includes a plurality of pixels arranged in a matrix. The display device includes a plurality of source lines (first wirings) supplied with source signals (also referred to as video signals, data signals, or the like) and a plurality of gate lines (second wirings) supplied with gate signals (also referred to as scan signals or the like). The source lines extend in a first direction, and the gate lines extend in a second direction that intersects the first direction.

Each pixel is provided for the intersection portion of one source line and one gate line. The pixel includes one or more display elements and one or more transistors. The pixel includes a pixel electrode functioning as an electrode of the display element.

When electrical noise that is caused by a signal supplied to the source line, the gate line, or another wiring is transmitted to the pixel electrode, the potential of the pixel electrode might be changed and the gray level of the pixel might be deviated from the intended value. As a result, the display quality of an image displayed by the display device is impaired. In particular, the frequency of a signal input to the source line is higher than that of a signal input to the gate line and thus greatly affects the potential of the pixel electrode.

As a measure for reducing such electrical crosstalk between the source line and the pixel electrode, physically separating the pixel electrode from the source line is considered. In particular, it is effective for reducing the crosstalk to prevent the source line and the pixel electrode from overlapping with each other. However, such a method requires a reduction in the area of the pixel electrode, leading to a decrease in the aperture ratio (effective light-emitting area ratio) of the display device.

Thus, in one embodiment of the present invention, the source line and the pixel electrode overlap with each other with a wiring (a third wiring) supplied with a constant potential positioned therebetween. Accordingly, electrical noise from the source line is blocked by the third wiring, whereby the electrical noise can be inhibited from being transmitted to the pixel electrode. Therefore, it becomes possible to increase the area of the pixel electrode, thereby increasing the aperture ratio of the display device.

The third wiring preferably supplies a constant potential to the pixel. For example, in the case where an organic EL element is used as the display element, the third wiring can also serve as a wiring that supplies an anode potential or a cathode potential to the organic EL element. In addition, the third wiring can also serve as a wiring that supplies a power supply potential (e.g., a high power supply potential (VDD) or a low power supply potential (VSS)) to the pixel.

The third wiring can have a top surface shape in the form of stripes that extend in the first direction, in which the source lines extend. Furthermore, the third wiring may have a portion that extends in the second direction and may have a top surface shape in the form of lattice that includes a portion along the first direction and a portion along the second direction.

Such a structure can inhibit the influence of the electrical crosstalk between the pixel electrode and the wirings including the source lines, whereby the pixel electrode and the wirings can be freely arranged to overlap with each other. Thus, a display device with extremely high resolution can be achieved. For example, it is possible to achieve a display device with a resolution higher than or equal to 1000 ppi, higher than or equal to 2000 ppi, higher than or equal to 3000 ppi, higher than or equal to 4000 ppi, or higher than or equal to 5000 ppi and lower than or equal to 30000 ppi, lower than or equal to 20000 ppi, or lower than or equal to 15000 ppi.

More specific examples are described below with reference to drawings.

Structure Example 1

FIG. 1A is a schematic perspective view illustrating a stacked-layer structure of one of subpixels of a display device 10. The subpixel includes a pixel circuit 11, a light-emitting element 12, a wiring 21, a wiring 22, and a wiring 23. The light-emitting element 12 includes a pixel electrode 24.

The wiring 21 functions as a source line and extends in a Y direction. The wiring 22 functions as a gate line and extends in an X direction. The wiring 23 is supplied with a constant potential and includes a portion extending in the Y direction.

The light-emitting element 12 is provided in the inside of the pixel electrode 24. As the light-emitting element 12, for example, an electroluminescence element in which a layer containing a light-emitting substance (also referred to as an EL layer) is interposed between a pair of electrodes is suitably used. The electroluminescence element emits light when current flows between the pair of electrodes. In particular, an organic EL element in which the EL layer contains a light-emitting organic compound is preferably used.

The pixel circuit 11 is a circuit for controlling a current that flows in the light-emitting element 12. The pixel circuit 11 preferably includes at least one transistor.

The pixel electrode 24 and the wiring 21 have a region where they overlap with each other in a plan view. Furthermore, the pixel electrode 24 and the wiring 21 overlap with each other with the wiring 23 positioned therebetween. Since the wiring 23 supplied with a constant potential is provided between the pixel electrode 24 and the wiring 21 in this manner, electrical noise due to the wiring 21 is blocked by the wiring 23 and inhibited from being transmitted to the pixel electrode 24 even when the pixel electrode 24 and the wiring 21 overlap with each other. Accordingly, the area of the pixel electrode 24 can be increased, and therefore, the light-emitting area of the light-emitting element 12 can be increased and the aperture ratio (effective light-emitting area ratio) of the display device 10 can be increased.

Here, in this specification and the like, a plan view refers to a view from the display surface side of the display device 10.

Figure 1B:
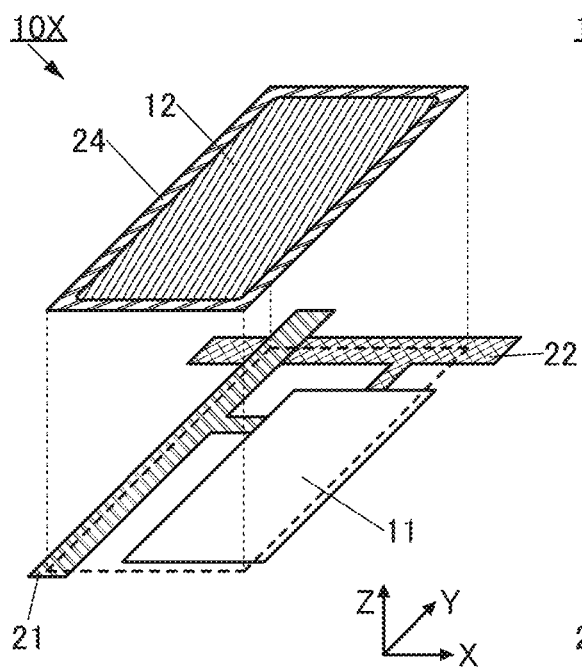

FIG. 1B illustrates a display device 10X that does not include the wiring 23, as an example. In that case, deviation of the gray scale in the luminance of the light-emitting element 12 may occur when electrical noise from the wiring 21 is transmitted to the pixel electrode 24 positioned above the wiring 21 and the potential of the pixel electrode 24 changes.

Figure 1C:
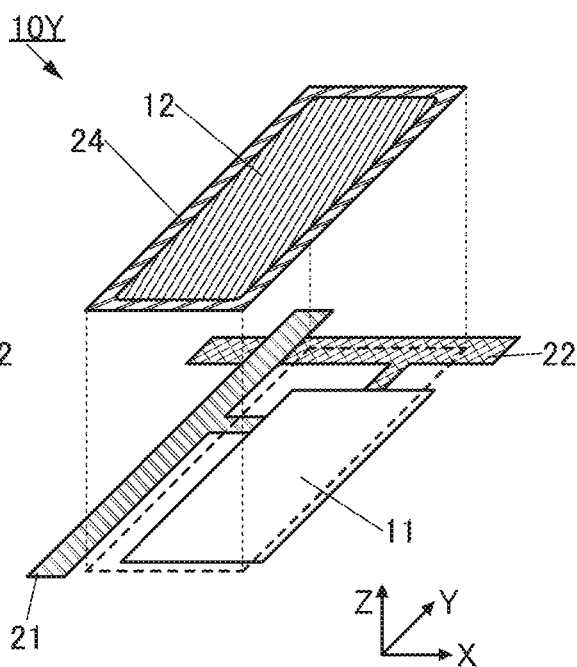

FIG. 1C illustrates, as an example, a display device 10Y in which the width of the pixel electrode 24 in the X direction is reduced so that the pixel electrode 24 does not overlap with the wiring 21. In this case, although crosstalk due to electrical noise from the wiring 21 can be inhibited, the light-emitting area of the light-emitting element 12 is small, so that the aperture ratio of the display device 10 is reduced.

As described above, the display device 10 of one embodiment of the present invention can have a high resolution and a high aperture ratio. Since the aperture ratio can be increased, the luminance can be increased and the power consumption can be reduced. Furthermore, a current required for a desired luminance can be reduced, so that a display device with low power consumption can be achieved.

Structure Example 2

A more specific structure example of the pixel will be described below.

Structure Example 2-1

Figure 2:
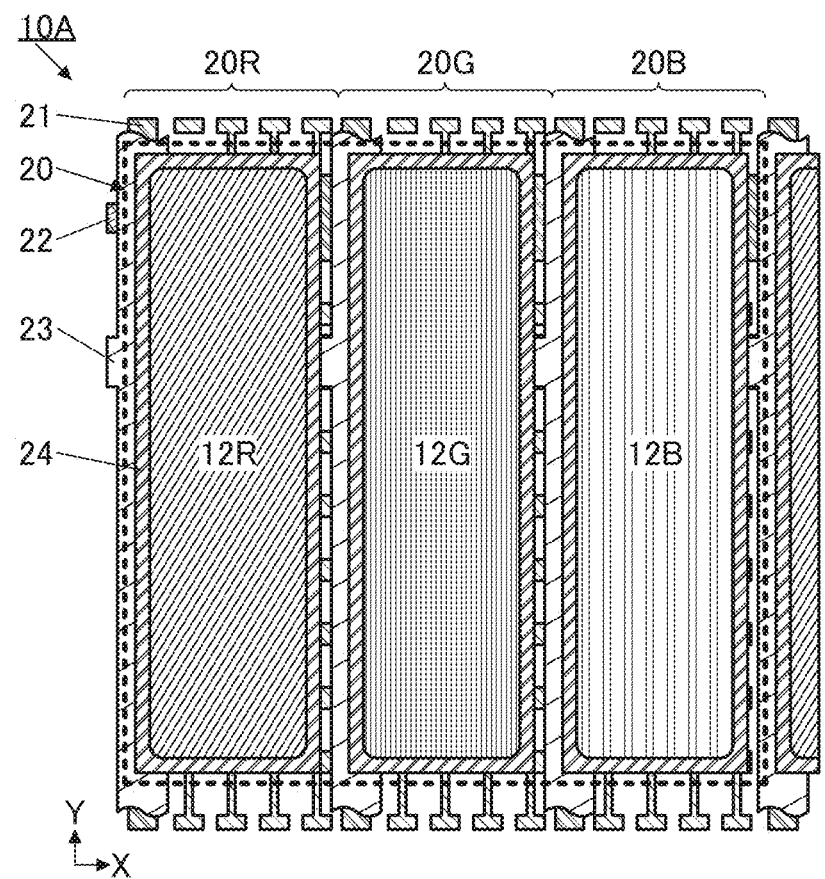
FIG. 2 illustrates a structure example of a display device.

FIG. 2 illustrates a schematic top view of a pixel 20 included in a display device 10A. The pixel 20 includes a subpixel 20R, a subpixel 20G, and a subpixel 20B. The display device 10A includes a plurality of pixels 20 that are arranged periodically in the X and Y directions.

The subpixel 20R includes a light-emitting element 12R emitting red light. The subpixel 20G includes a light-emitting element 12G emitting green light. The subpixel 20B includes a light-emitting element 12B emitting blue light.

The light-emitting elements 12R, 12G, and 12B may contain different light-emitting materials from each other, may each have a structure with a combination of a white light-emitting element and a color filter, or may each have a structure with a combination of a blue or violet light-emitting element and a color conversion material (e.g., quantum dots).

FIGS. 3A to 3E each illustrate a schematic top view of a subpixel 20X, one of the subpixels included in the pixel 20 illustrated in FIG. 2. The subpixel 20X can be used as any of the subpixels 20R, 20G, and 20B. The light-emitting element is omitted here.

Figure 3A:
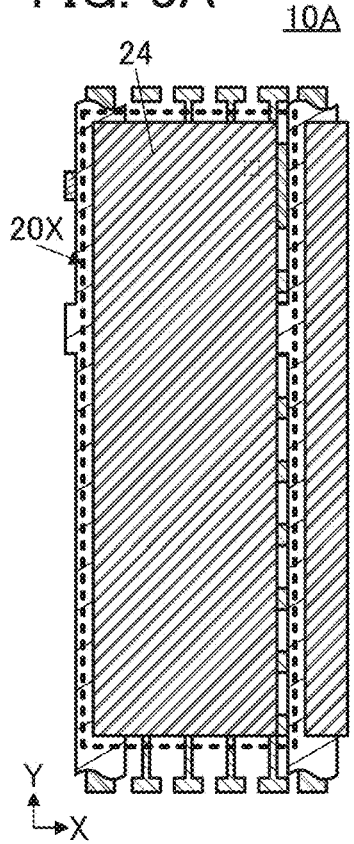
FIGS. 3A to 3E each illustrate a structure example of a display device.
Figure 3B:
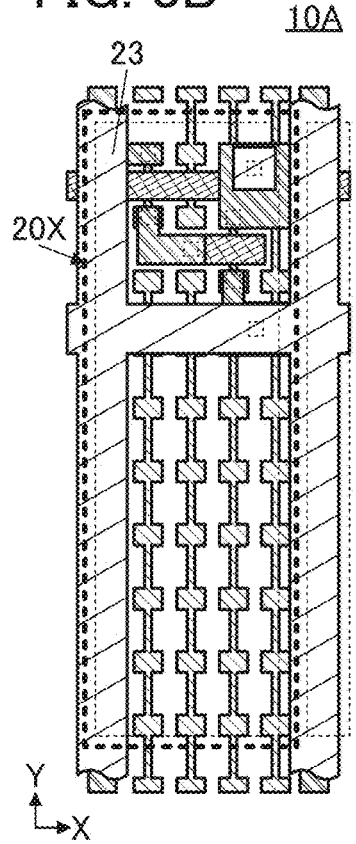

FIG. 3B illustrates an example of the top surface shape of the wiring 23, in which the pixel electrode 24 illustrated in FIG. 3A is shown only by its outline with dashed lines.

The wiring 23 functions as a power supply line for the light-emitting element 12 and is supplied with a constant potential. In the case where the pixel electrode 24 functions as an anode, the wiring 23 is supplied with a high power supply potential; in the case where the pixel electrode 24 functions as a cathode, the wiring 23 is supplied with a low power supply potential.

As illustrated in FIG. 3B, it is preferable that the wiring 23 include not only a portion extending in the Y direction but also a portion extending in the X direction. Thus, the wiring 23 can have a top surface shape in the form of lattice, so that the electrical resistance can be lower than that in the case of a top surface shape in the form of stripes and the influence of voltage drop can be inhibited.

Figure 3C:
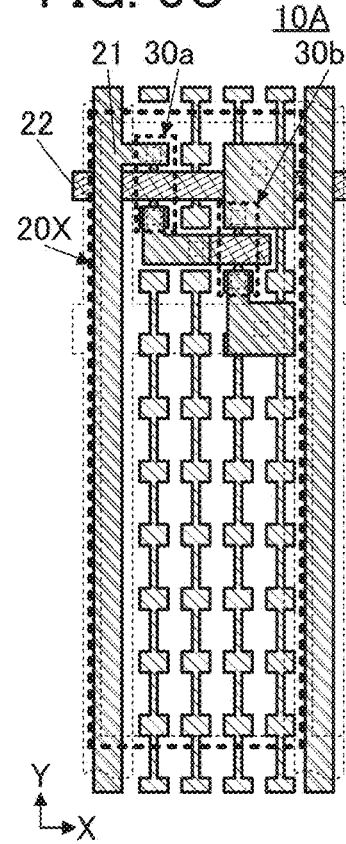

In FIG. 3C, the wiring 23 in FIG. 3B is shown only by its outline with dashed lines. In FIG. 3C, the same hatching pattern is used for the wiring 22 and a conductive layer formed by processing the same conductive film as the wiring 22. Similarly, in FIG. 3C, the same hatching pattern is used for the wiring 21 and a conductive layer formed by processing the same conductive film as the wiring 21.

Figure 3D:
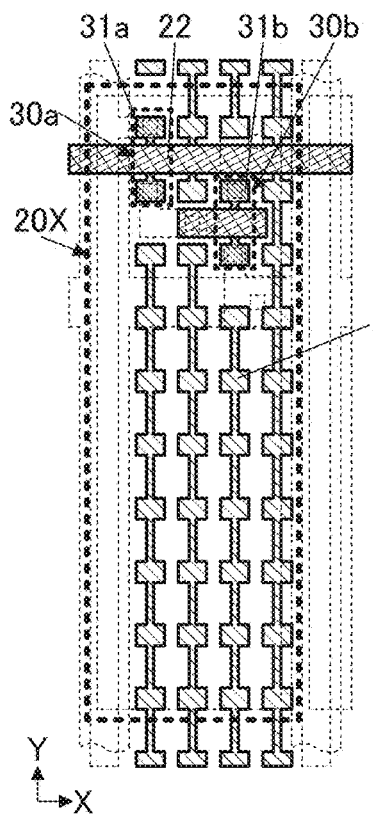
Figure 3E:
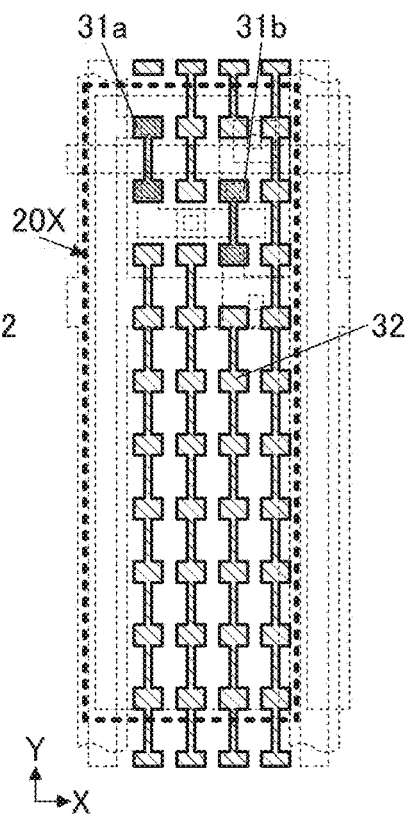
Figure 4A:
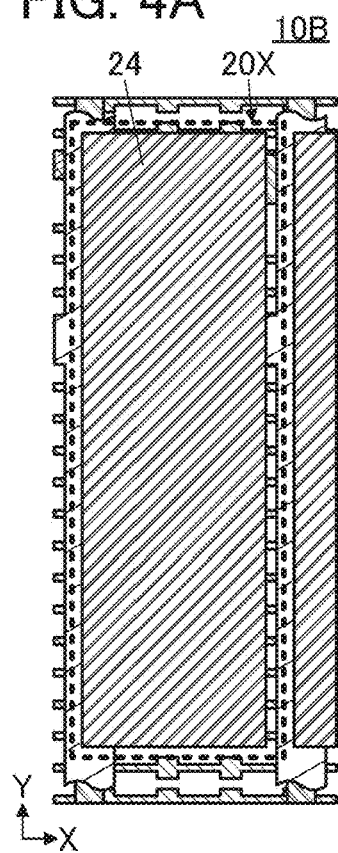
FIGS. 4A to 4E each illustrate a structure example of a display device.
Figure 4B:
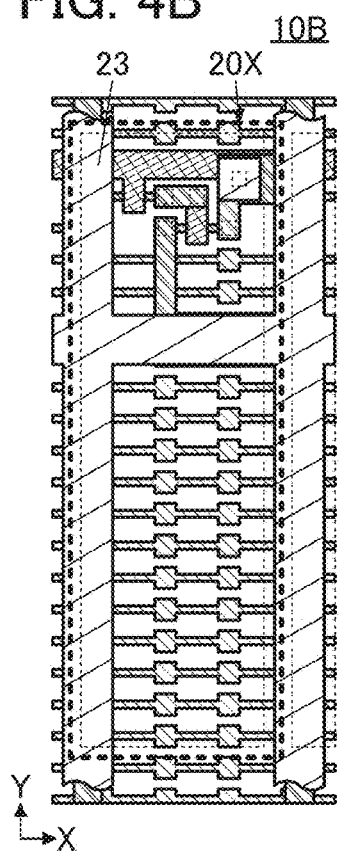
Figure 4C:
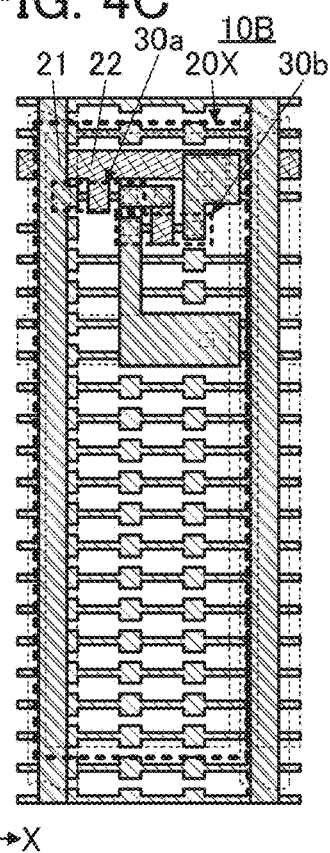
Figure 4D:
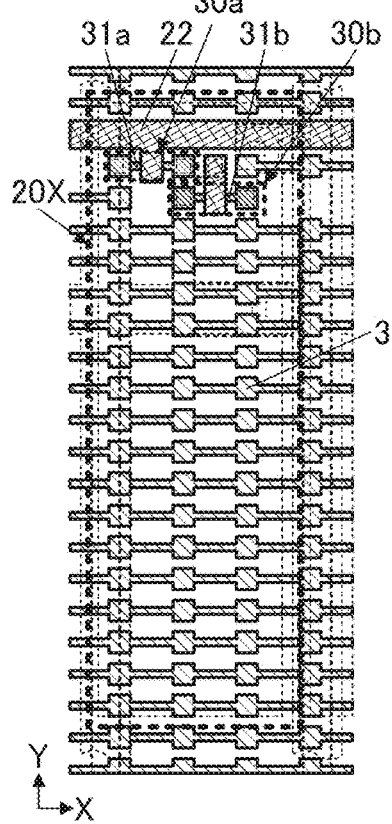
Figure 4E:
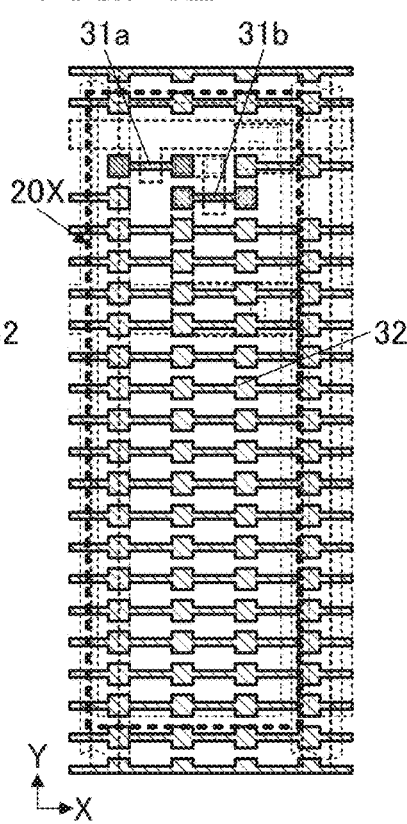

In FIG. 3D, the wiring 21 in FIG. 3C and the conductive layer formed by processing the same conductive film as the wiring 21 are shown only by their outlines with dashed lines. In FIG. 3E, the wiring 22 in FIG. 3D and the conductive layer formed by processing the same conductive film as the wiring 22 are shown only by their outlines with dashed lines.

FIGS. 3C and 3D illustrate a transistor 30a and a transistor 30b. FIG. 3D also illustrates a semiconductor layer 31a included in the transistor 30a and a semiconductor layer 31b included in the transistor 30b. The transistor 30a functions as a selection transistor that controls selection/non-selection of the subpixel. The transistor 30b functions as a driver transistor that controls a current flowing to the light-emitting element.

Part of a gate of the transistor 30a is composed of the wiring 22, one of a source and a drain of the transistor 30a is electrically connected to the wiring 21, and the other of the source and the drain of the transistor 30a is electrically connected to a gate of the transistor 30b. One of a source and a drain of the transistor 30b is electrically connected to the wiring 23, and the other of the source and the drain of the transistor 30b is electrically connected to the pixel electrode 24.

In the example described here, each top surface shape of the semiconductor layers 31a and 31b includes a pair of thick portions where contact portions are provided and a thin portion formed as a channel. The semiconductor layers of the two transistors are preferably formed to have substantially the same top surfaces shapes in this manner, in which case the electrical characteristic of the transistors can be uniform and designing is facilitated. Note that a transistor with desired electrical characteristics can be formed with a combination of semiconductor layers of the same pattern. For example, a plurality of semiconductor layers can be arranged in parallel and connected in one transistor so that the channel width of the transistor can be an integral multiple of that of the other transistor. Alternatively, a plurality of semiconductor layers can be arranged in serial and connected in one transistor, whereby the channel length of the transistor can be an integral multiple of that of the other transistor.

In the display device 10A, the semiconductor layer 31a included in the transistor 30a and the semiconductor layer 31b included in the transistor 30b are each placed so that current can flow in the Y direction, i.e., a direction parallel to the direction in which the wiring 21 extends. In other words, the transistors 30a and 30b are each placed so that the channel length direction thereof can be parallel to the Y direction and the channel width direction thereof can be parallel to the X direction. In this manner, the direction of current flow is preferably the same for the plurality of transistors included in the pixel, in which case variation of the electrical characteristics can be inhibited and designing can be facilitated.

Here, as illustrated in FIG. 3D and the like, a plurality of dummy layers 32 is preferably provided. The dummy layers 32 are formed by processing the same film as the semiconductor layers 31a and 31b and can have the same composition as the semiconductor layers 31a and 31b. In FIGS. 3A to 3E, different hatching patterns are used for the semiconductor layers 31a and 31b and the dummy layer 32 to differentiate the semiconductor layers 31a and 31b from the dummy layers 32.

A top surface of the dummy layer 32 has preferably the same shape as those of the semiconductor layers 31a and 31b or a shape in which the shapes of the top surfaces of the semiconductor layers 31a and 31b are periodically combined. In the display device 10A, each of dummy layers 32 has a top surface shape that includes two or more thick portions and a thin portion(s) that connect adjacent thick portions in the Y direction. Every dummy layer 32 is provided so that the longitudinal direction thereof can be parallel to the Y direction. Furthermore, each of the dummy layers 32 is provided across a plurality of pixels lined in the Y direction.

In this manner, when the dummy layers 32 are provided in a region where neither the semiconductor layer 31a nor the semiconductor layer 31b is provided, variations in processing shapes of the semiconductor layers 31a and 31b can be reduced, so that variations in the electrical characteristics of the transistors 30a and 30b can be reduced. Note that a dummy layer is provided in a vacant space for the purposes of stabilization of the manufacturing process, a reduction in the processing variation, and the like, and is basically not considered as a component of the circuit. For this reason, the dummy layer is electrically floating or supplied with a constant voltage. Note that a dummy layer is preferably provided for a layer other than the semiconductor layer.

The dummy layers 32 are preferably provided so as to be laid throughout the region where neither the semiconductor layer 31a nor the semiconductor layer 31b is provided, as much as possible. Although the display device 10A is an example in which the dummy layers 32 are provided in a region other than the region where the wiring 21 provided, the dummy layers 32 may be provided to overlap with the wiring 21.

Note that although two transistors are provided in one subpixel in this example, one embodiment of the present invention is not limited thereto; three or more transistors may be provided. In that case, it is preferable that semiconductor layers of all the transistors provided in a subpixel have the same patterns and the directions of currents flowing in the semiconductor layers be the same as one another.

The above is the description of Structure example 2-1.

Structural examples that is partly different from the above structure example will be described below with reference to drawings. Note that portions similar to those described above are not described below in some cases. In the drawings shown below, the same reference numerals and the same hatching patterns are used for components having the same function and description thereof is omitted in some cases.

Structure Example 2-2

FIGS. 4A to 4E are schematic top views of the subpixel 20X included in a display device 10B. The display device 10B differs from the display device 10A mainly in the orientations of the semiconductor layers 31a and 31b and the dummy layers 32.

The semiconductor layers 31a and 31b are each placed so that current flows in the X direction, i.e., a direction parallel to a direction in which the wiring 22 extends. In other words, the transistors 30a and 30b are each placed so that the channel length direction thereof is parallel to the X direction and the channel width direction thereof is parallel to the Y direction.

The dummy layer 32 is placed so that the longitudinal direction thereof is parallel to the X direction. The dummy layer 32 is provided across a plurality of pixels lined in the X direction.

Note that the display device 10B is an example in which the dummy layer 32 includes a region overlapping with the wiring 21.

Structure Example 2-3

FIGS. 5A to 5E are schematic top views of the subpixel 20X included in a display device 10C. The display device 10C differs from the display device 10A mainly in including no dummy layer 32.

Note that the display device 10B illustrated in Structure example 2-2 may have a structure including no dummy layer 32, like the display device 10C.

Structure Example 3

A structure example of a display device different from Structural example 2 will be described below. Note that portions similar to those described above are denoted by the same reference numerals as those described above and are not described in some cases.

[Example of Pixel Arrangement]

Figure 6A:
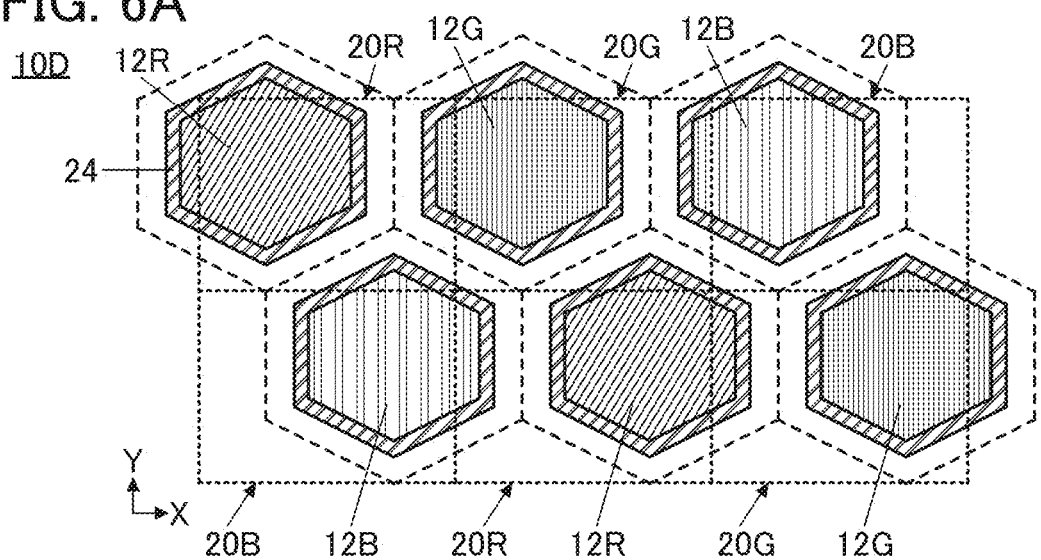
FIGS. 6A to 6D illustrate a structure example of a display device.

FIG. 6A is a schematic top view of part of a display device 10D. FIG. 6A illustrates an example of a way of arranging six light-emitting elements. A structure illustrated in FIG. 6A is one unit, and units are arranged in the X and Y directions repeatedly in a pixel portion included in the display device 10D.

FIG. 6A illustrates six pixel electrodes 24, two light-emitting elements 12R, two light-emitting elements 12G, and two light-emitting elements 12B. Regions where two subpixels 20R, two subpixels 20G, and two subpixels 20B are provided are shown by dashed lines.

Each of the light-emitting elements is placed in the inside of one of closest-packed hexagonal regions. Focusing on one of the light-emitting elements, the light-emitting element is placed so as to be surrounded by six light-emitting elements. In addition, the light-emitting elements are arranged so that adjacent light-emitting elements have different colors. For example, focusing on the light-emitting element 12R, the light-emitting element 12R is surrounded by three light-emitting elements 12G and three light-emitting elements 12B that are alternately arranged.

It is preferable that a light-emitting region of the light-emitting element also have a hexagonal top surface shape. It is preferable that the pixel electrode 24 also have a hexagonal top surface shape.

Figure 6B:
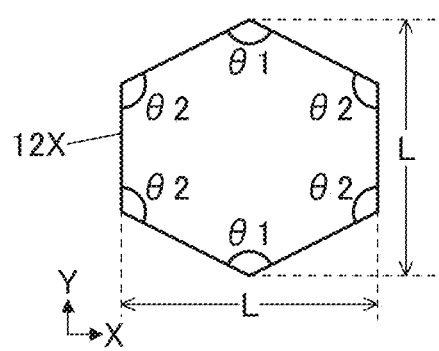
Figure 6C:
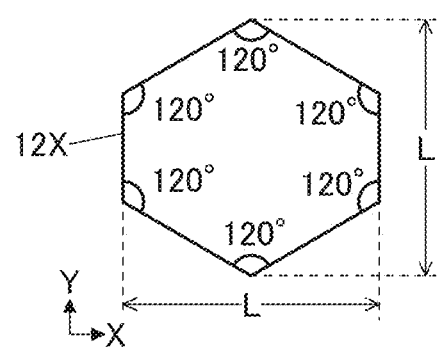

FIGS. 6B and 6C each illustrate an example of the top surface shape of the light-emitting region of the light-emitting element 12.

In a light-emitting element 12X illustrated in FIGS. 6B and 6C, a length between a pair of vertices positioned in the Y direction and a distance between a pair of sides extending in the Y direction are equal to each other and are each a length L. Therefore, the alignment pitch of pixels in the X direction can be the same as that in the Y direction. Note that in the case of a closest-packed arrangement of regular hexagons, it is difficult to make the arrangement pitches in the X and Y directions equal to each other; therefore, it is preferable not to use regular hexagons.

In the light-emitting element 12X illustrated in FIG. 6B, interior angles (angles θ1) of the pair of vertices positioned in the Y direction are equal to each other, and interior angles (angles θ2) of the other four vertices are equal to each other. Here, the angle θ1 is larger than 120°, and the angle θ2 is smaller than 120°.

In the light-emitting element 12X illustrated in FIG. 6C, all of the six interior angles are each 120°. In addition, the length of each of the pair of sides extending in the Y direction is shorter than each of the other sides.

Actually, the vertices of the top surface of the light-emitting element 12X are often rounded; therefore, the above-described angles and lengths of the sides are applied to a hexagonal figure similar to the light-emitting element 12X The shape of the light-emitting element 12X has been described above. It is preferable that the pixel electrode have a similar shape also. At this time, the light-emitting region can be provided so as to overlap with the pixel electrode and be positioned in the inside side of the pixel electrode in a plan view.

Figure 6D:
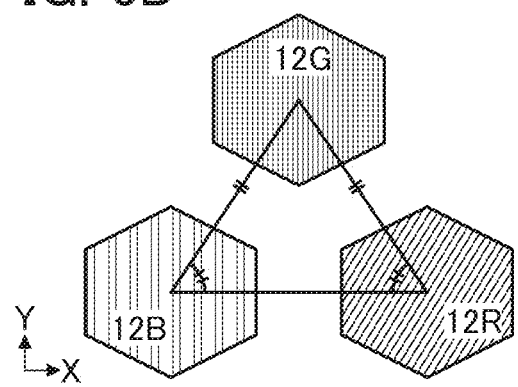

FIG. 6D illustrates the positions of three adjacent light-emitting elements (the light-emitting elements 12R, 12G, and 12B). As illustrated in FIG. 6D, the three light-emitting elements are preferably arranged on the vertices of an isosceles triangle. At this time, in the isosceles triangle, the angle of the vertex positioned in the Y direction is preferably larger than each of the angles of the vertices at the ends of a side parallel to the X direction.

Structure Example 3-1

Next, a more specific structure example of the pixel will be described.

Figure 7:
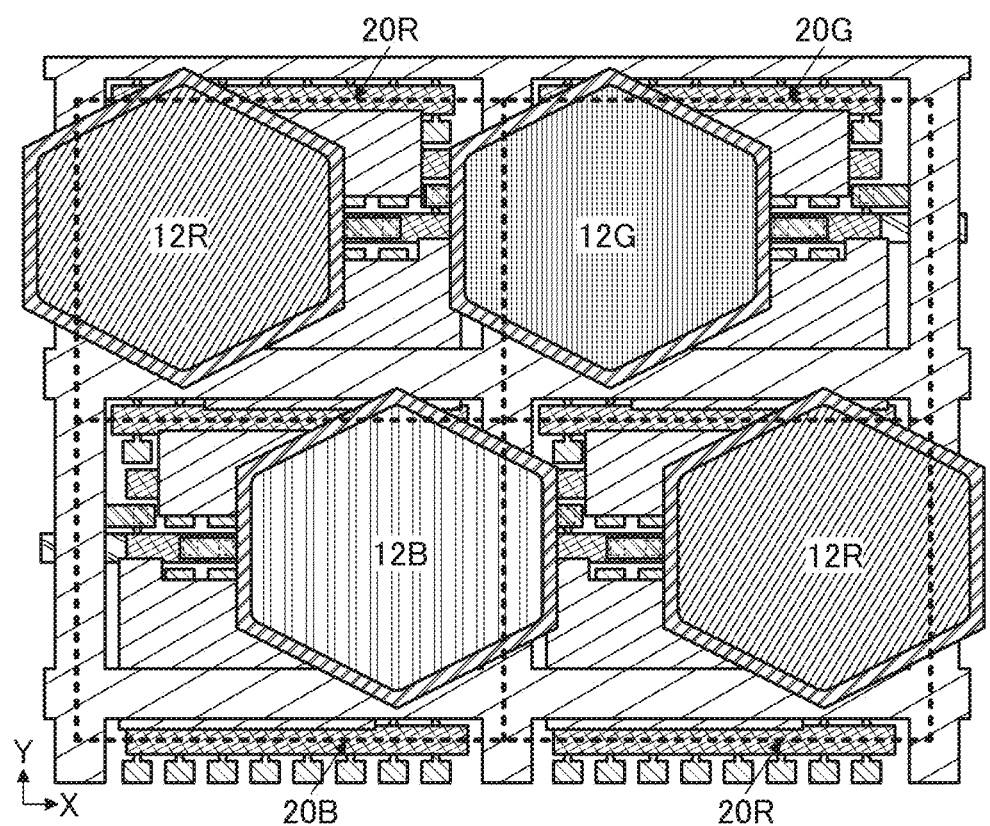
FIG. 7 illustrates a structure example of a display device.

FIG. 7 illustrates a schematic top view of a display device 10E. A region including 2×2 subpixels is shown in FIG. 7. A subpixel 20G, a subpixel 20B, and two subpixels 20R are shown in FIG. 7.

Figure 8A:
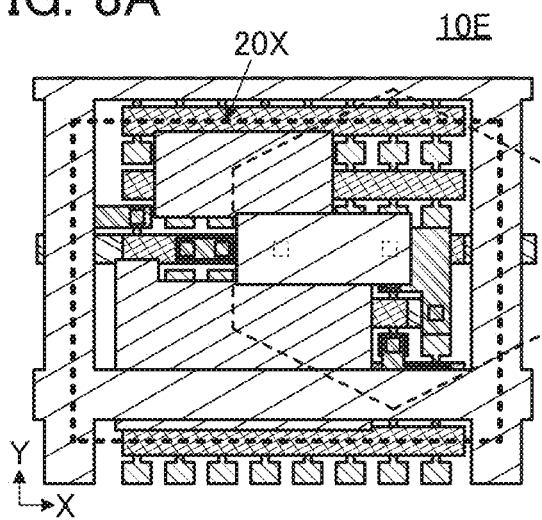
FIGS. 8A to 8F each illustrate a structure example of a display device.

FIG. 8A illustrates a schematic top view of a subpixel 20X, one of the subpixels included in the display device 10E. The subpixel 20X can be used as any of the subpixels 20R, 20G, and 20B in FIG. 7. In FIG. 8A, the pixel electrode 24 is shown only by its outline with dashed lines.

Figure 8B:
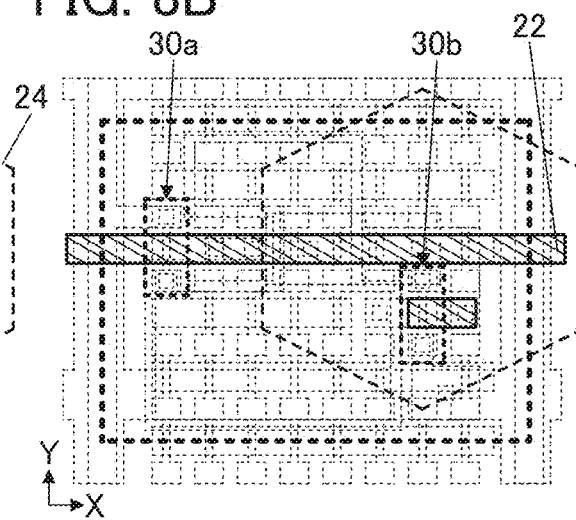
Figure 8C:
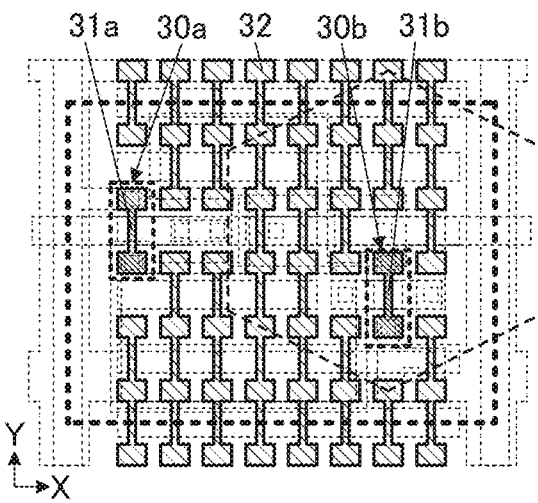
Figure 8D:
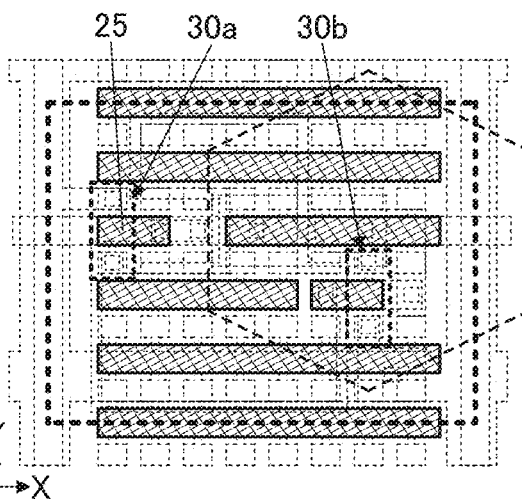
Figure 8E:
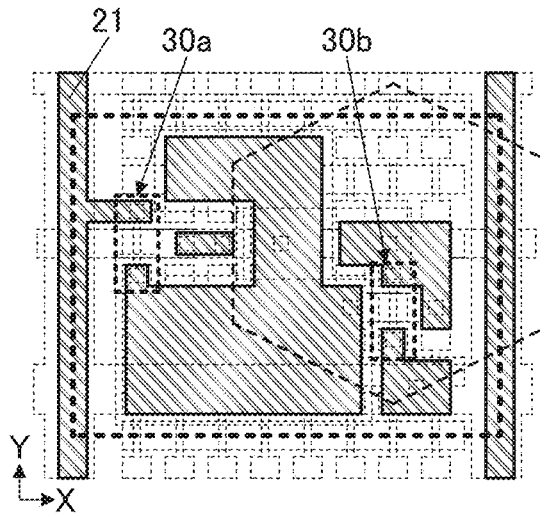
Figure 8F:
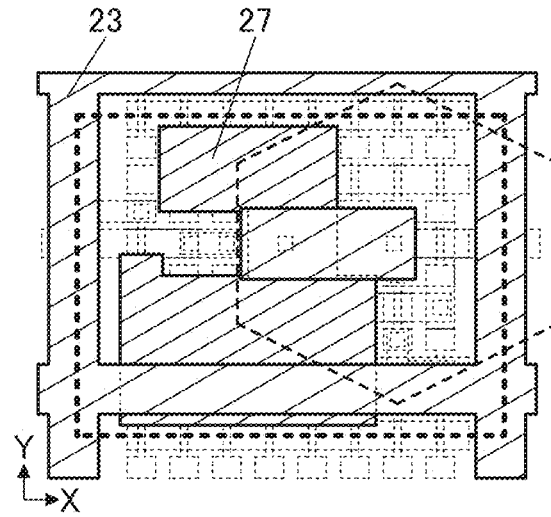

FIGS. 8B to 8F illustrate the layout of layers that form the subpixel 20X. FIG. 8B illustrates a layer positioned closest to a formation surface, FIG. 8F illustrates two layers closest to the pixel electrode 24.

FIG. 8B illustrates a layer including the wiring 22 and a conductive layer that is obtained by processing the same conductive film as the wiring 22. Part of them functions as one gate electrode (also referred to as a bottom gate electrode, a first gate electrode, or the like) of the transistor 30a or 30b.

FIG. 8C illustrates a layer including the semiconductor layers 31a and 31b and a plurality of dummy layers 32. Although the channel length direction is parallel to the Y direction in FIG. 8C, the channel length direction may be parallel to the X direction in a manner similar to that in Structural example 2-2 described above.

FIG. 8D illustrates a layer including a plurality of conductive layers 25. Part of the conductive layers 25 functions as the other gate electrode (also referred to as a top gate electrode, a second gate electrode, or the like) of the transistor 30a or 30b. In addition, a conductive layer 25 that is electrically floating may be provided as a dummy layer. With the dummy layer, variations in the processing shape of the conductive layer 25 and the like can be reduced.

FIG. 8E illustrates a layer including the wiring 21 and a plurality of conductive layers obtained by processing the same conductive film as the wiring 21. Part of the plurality of conductive layers in FIG. 8E functions as one of a source electrode and a drain electrode of the transistor 30a or 30b. Part of the plurality of conductive layers in FIG. 8E functions as one electrode of a capacitor.

FIG. 8F illustrates a layer that includes a conductive layer 27 and a layer that includes the wiring 23 positioned above the layer including the conductive layer 27 and a conductive film obtained by processing the same conductive film as the wiring 23. The pixel electrode 24 is provided above the wiring 23. Part of the conductive layer 27 functions as the other electrode of the capacitor. Part of the conductive layer obtained by processing the same conductive film as the wiring 23 functions as a relay wiring that electrically connects the pixel electrode 24 and the transistor 30b.

Structure Example 3-2

The structure of the subpixel including two transistors has been described above, and a structure example of a subpixel including four transistors will be described below. In the description below, Structural example 3-1 and the like are referred to for portions similar to those described in Structural example 3-1 and the like, and description of the portions is omitted in some cases.

FIGS. 9A to 9F illustrate a structure example of a display device 10F including the subpixel 20X with four transistors.

The subpixel 20X includes the transistor 30a, the transistor 30b, a transistor 30c, and a transistor 30d.

Figure 9A:
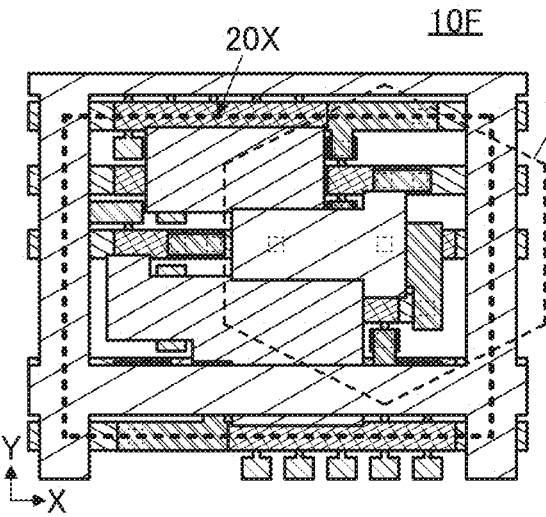
FIGS. 9A to 9F each illustrate a structure example of a display device.
Figure 9B:
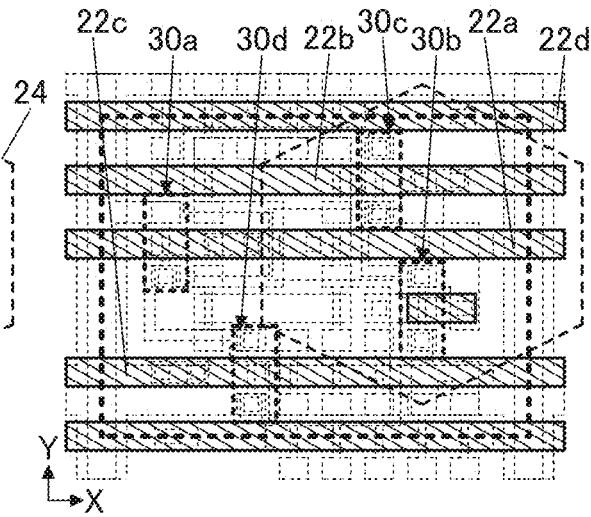

As illustrated in FIG. 9B, three gate lines (wirings 22a, 22b, and 22c) and a wiring 22d supplied with a constant potential are provided. Part of the wiring 22a functions as one of gate electrodes of the transistor 30a. Part of the wiring 22b functions as one of gate electrodes of the transistor 30c. Part of the wiring 22c functions as one of gate electrodes of the transistor 30d.

Figure 9C:
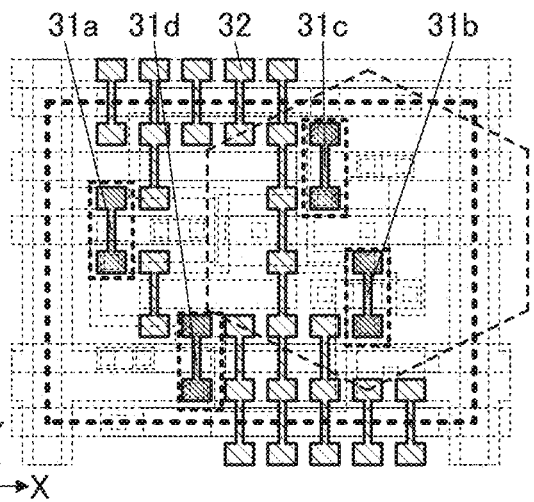

As illustrated in FIG. 9C, a semiconductor layer 31c included in the transistor 30c and a semiconductor layer 31d included in the transistor 30d are placed so that current flows in the Y direction in a manner similar to that of the semiconductor layers 31a and 31b. The dummy layer 32 is provided in a space between the semiconductor layers so that the longitudinal direction of the dummy layer can be parallel to the Y direction. Although the channel length direction is parallel to the Y direction in FIG. 9C, the channel length direction may be parallel to the X direction in a manner similar to that in Structural example 2-2 described above.

Figure 9D:
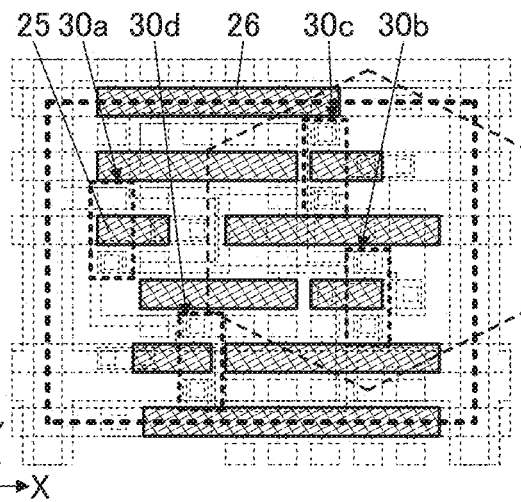
Figure 9E:
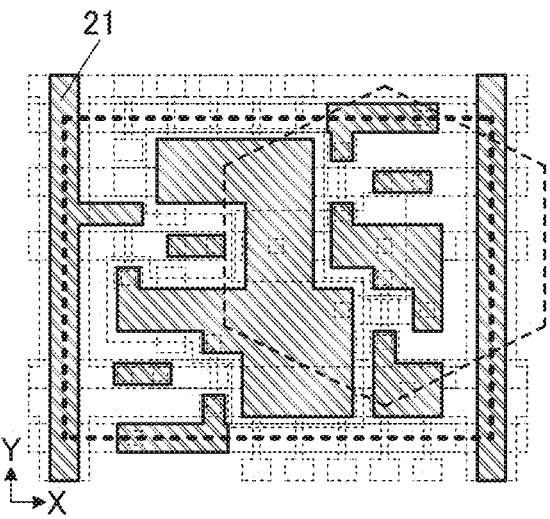
Figure 9F:
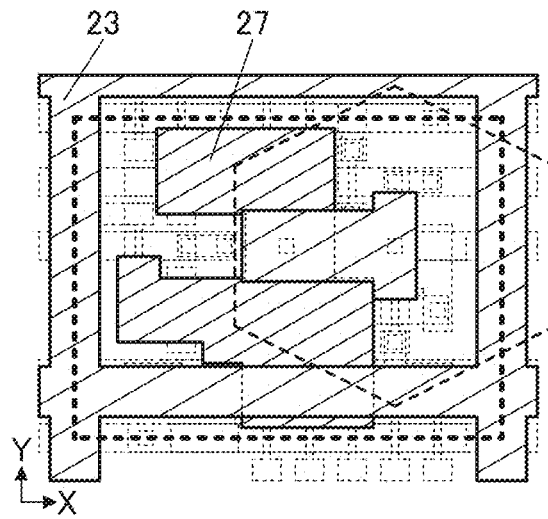

As illustrated in FIGS. 9B to 9D, the transistors 30a, 30b, 30c, and 30d are each a transistor including a pair of gate electrodes. Note that one or more of the four transistors may be transistors each including only one gate (single-gate transistors) and the other transistors may be transistors each including a pair of gates (dual-gate transistors).

[Pixel Circuit]

A structural example of a pixel circuit and an example of a driving method thereof, which are applicable to the display device of one embodiment of the present invention, will be described below.

[Structure Example of Pixel Circuit]

Figure 10A:
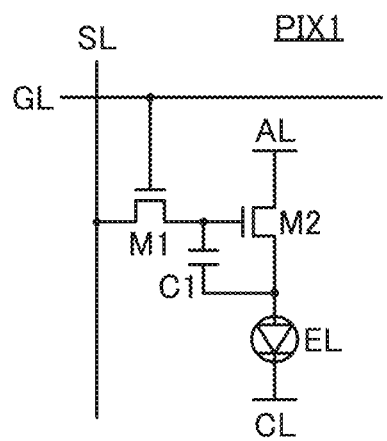
FIGS. 10A to 10D are circuit diagrams each illustrating a structure example of a display device.

A pixel circuit PIX1 illustrated in FIG. 10A includes a transistor M1, a transistor M2, a capacitor C1, and a light-emitting element EL. Wirings SL, GL, AL, and CL are electrically connected to the pixel circuit PIX1.

A gate of the transistor M1 is electrically connected to the wiring GL, one of a source and a drain of the transistor M1 is electrically connected to the wiring SL, and the other of the source and the drain of the transistor M1 is electrically connected to a gate of the transistor M2 and one electrode of the capacitor C1. One of a source and a drain of the transistor M2 is electrically connected to the wiring AL and the other of the source and the drain of the transistor M2 is electrically connected to an anode of the light-emitting element EL. The other electrode of the capacitor C1 is electrically connected to the anode of the light-emitting element EL. A cathode of the light-emitting element EL is electrically connected to the wiring CL.

The transistor M1 can be referred to as a selection transistor and functions as a switch for controlling selection/non-selection of the pixel. The transistor M2 can be referred to as a driver transistor and has a function of controlling a current flowing to the light-emitting element EL. The capacitor C1 functions as a storage capacitor and has a function of retaining a gate potential of the transistor M2. A capacitor such as a MIM capacitor may be used as the capacitor C1; alternatively, capacitance between wirings, a gate capacitance of the transistor, or the like may be used as the capacitor C1.

The wiring SL is supplied with a source signal. The wiring GL is supplied with a gate signal. The wirings AL and CL are each supplied with a constant potential. In the light-emitting element EL, the anode side can have a high potential and the cathode side can have a lower potential than the anode side.

Figure 10B:
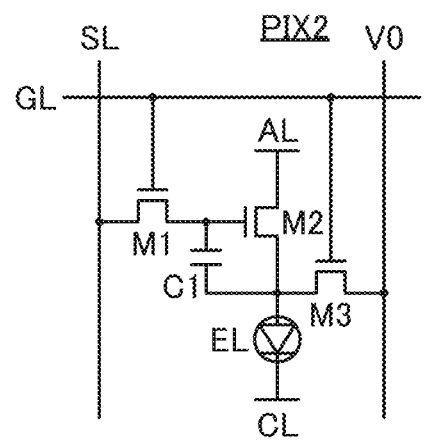

The pixel circuit PIX2 illustrated in FIG. 10B has a structure in which a transistor M3 is added to the pixel circuit PIX1. In addition, a wiring V0 is electrically connected to the pixel circuit PIX2.

A gate of the transistor M3 is electrically connected to the wiring GL, one of a source and a drain of the transistor M3 is electrically connected to the anode of the light-emitting element EL, and the other of the source and the drain of the transistor M3 is electrically connected to the wiring V0.

The wiring V0 is supplied with a constant potential when data is written to the pixel circuit PIX2. Thus, a variation in the gate-source potential of the transistor M2 can be inhibited.

Figure 10C:
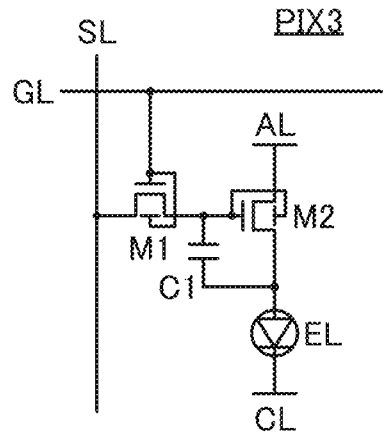
Figure 10D:
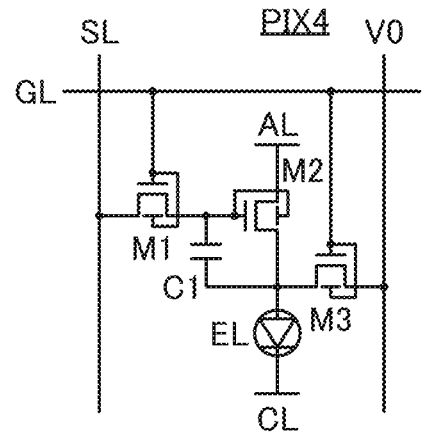

A pixel circuit PIX3 illustrated in FIG. 10C is an example in the case where a transistor in which a pair of gates are electrically connected to each other is used as each of the transistors M1 and M2 of the pixel circuit PIX1. A pixel circuit PIX4 illustrated in FIG. 10D is an example in the case where such transistors are used in the pixel circuit PIX2. With these structures, a current that can flow through the transistor can be increased. Although the transistor in which the pair of gates are connected to each other is used as every transistor here, one embodiment of the present invention is not limited thereto. A transistor that includes a pair of gates electrically connected to different wirings may be used. When, for example, a transistor in which one of the gates is electrically connected to the source is used, the reliability can be increased.

Figure 11A:
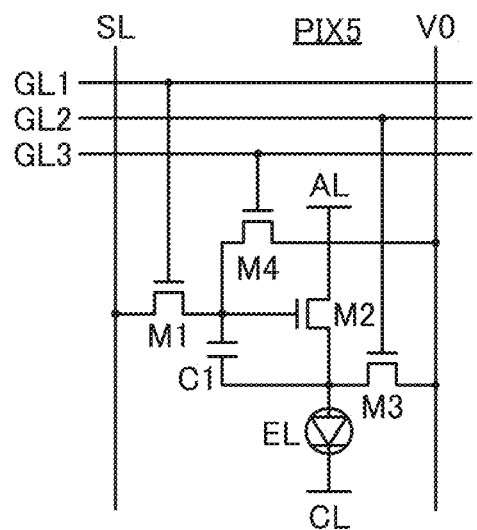
FIG. 11A to FIG. 11D are circuit diagrams each illustrating a structure example of a display device.

A pixel circuit PIX5 illustrated in FIG. 11A has a structure in which a transistor M4 is added to the pixel circuit PIX2. Three wirings (wirings GL1, GL2, and GL3) functioning as gate lines are electrically connected to the pixel circuit PIX5.

A gate of the transistor M4 is electrically connected to the wiring GL3, one of a source and a drain of the transistor M4 is electrically connected to the gate of the transistor M2, and the other of the source and the drain of the transistor M4 is electrically connected to the wiring V0. The gate of the transistor M1 is electrically connected to the wiring GL1, and the gate of the transistor M3 is electrically connected to the wiring GL2.

When the transistors M3 and M4 are turned on at the same time, the source and the gate of the transistor M2 have the same potential, so that the transistor M2 can be turned off. Thus, a current flowing to the light-emitting element EL can be blocked forcibly. Such a pixel circuit is suitable for the case of using a display method in which a display period and an off period are alternately provided.

Figure 11B:
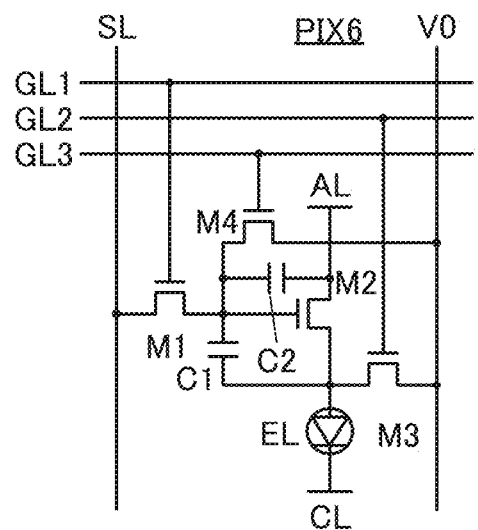

A pixel circuit PIX6 illustrated in FIG. 11B is an example in the case where a capacitor C2 is added to the pixel circuit PIX5. The capacitor C2 functions as a storage capacitor.

Figure 11C:
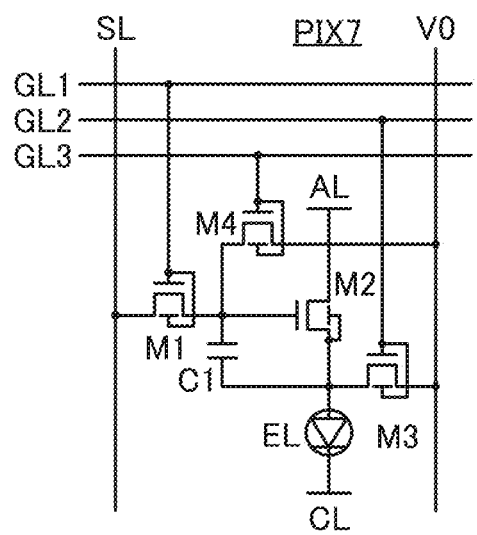
Figure 11D:
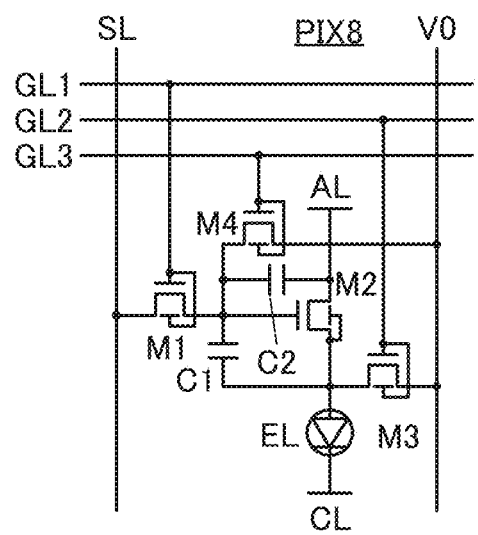

A pixel circuit PIX7 illustrated in FIG. 11C and a pixel circuit PIX8 illustrated in FIG. 11D are each an example in the case where a transistor including a pair of gates is used in the pixel circuit PIX5 or the pixel circuit PIX6. A transistor in which a pair of gates are electrically connected to each other is used as each of the transistors M1, M3, and M4, and a transistor in which one of gates is electrically connected to a source is used as the transistor M2.

[Example of Driving Method]

An example of a method for driving a display device in which the pixel circuit PIX5 is used will be described below. Note that a similar driving method can be applied to the pixel circuits PIX6, PIX7, and PIX8.

Figure 12:
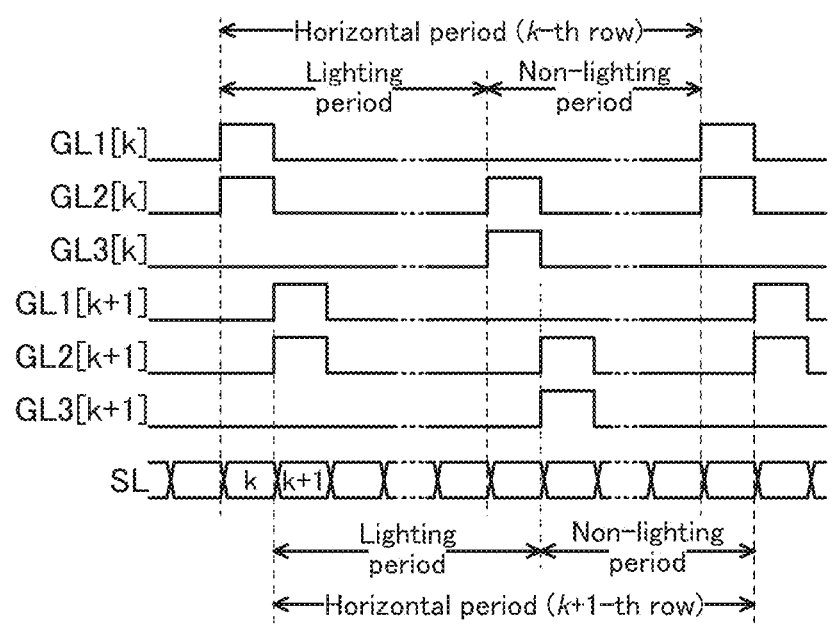
FIG. 12 is a timing chart showing an example of a method for driving a display device.

FIG. 12 shows a timing chart of a method for driving the display device in which the pixel circuit PIX5 is used. Changes in the potentials of wirings GL1[$k$], GL2[$k$], and GL3[$k$] that are gate lines of the k-th row and changes in the potentials of wirings GL1[$k$+1], GL2[$k$+1], and GL3[$k$+1] that are gate lines of the k+1-th row are shown here. FIG. 12 also shows the timing of supplying a signal to the wiring SL functioning as a source line.

In the example of the driving method described here, one horizontal period is divided into a lighting period and a non-lighting period. A horizontal period of the k-th row is shifted from a horizontal period of the k+1-th row by a selection period of the gate line.

In the lighting period of the k-th row, first, the wirings GL1[$k$] and GL2[$k$] are supplied with a high-level potential and the wiring SL is supplied with a source signal. Thus, the transistors M1 and M3 are turned on, so that a potential corresponding to the source signal is written from the wiring SL to the gate of the transistor M2. After that, the wirings GL1[$k$] and GL2[$k$] are supplied with a low-level potential, so that the transistors M1 and M3 are turned off and the gate potential of the transistor M2 is retained.

Subsequently, in a lighting period of the k+1-th row, data is written by operation similar to that described above.

Next, the non-lighting period is described. In the non-lighting period of the k-th row, the wirings GL2[$k$] and GL3[$k$] are supplied with a high-level potential. Accordingly, the transistors M3 and M4 are turned on, and the source and the gate of the transistor M2 are supplied with the same potential, so that almost no current flows through the transistor M2. Therefore, the light-emitting element EL is turned off. As a result, all the subpixels that are positioned in the k-th row are turned off. The subpixels of the k-th row remain in the off state until the next lighting period.

Subsequently, in a non-lighting period of the k+1-th row, all the subpixels of the k+1-th row are turned off in a manner similar to that described above.

Such a driving method described above, in which the subpixels are not constantly on through one horizontal period and a non-lighting period is provided in one horizontal period, can be called duty driving. With duty driving, an afterimage phenomenon can be inhibited at the time of displaying moving images; therefore, a display device with high performance in displaying moving images can be achieved. Particularly in a VR device and the like, a reduction in an afterimage can reduce what is called VR sickness.

In the duty driving, the proportion of the lighting period to one horizontal period can be called a duty cycle. For example, a duty cycle of 50% means that the lighting period and the non-lighting period have the same lengths. Note that the duty cycle can be set freely and can be adjusted appropriately within a range higher than 0% and lower than or equal to 100%, for example.

The above is the description of the example of the driving method.

[Example of Cross-Sectional Structure]

Next, examples of a cross-sectional structure of a display device of one embodiment of the present invention will be described.

Figure 13:
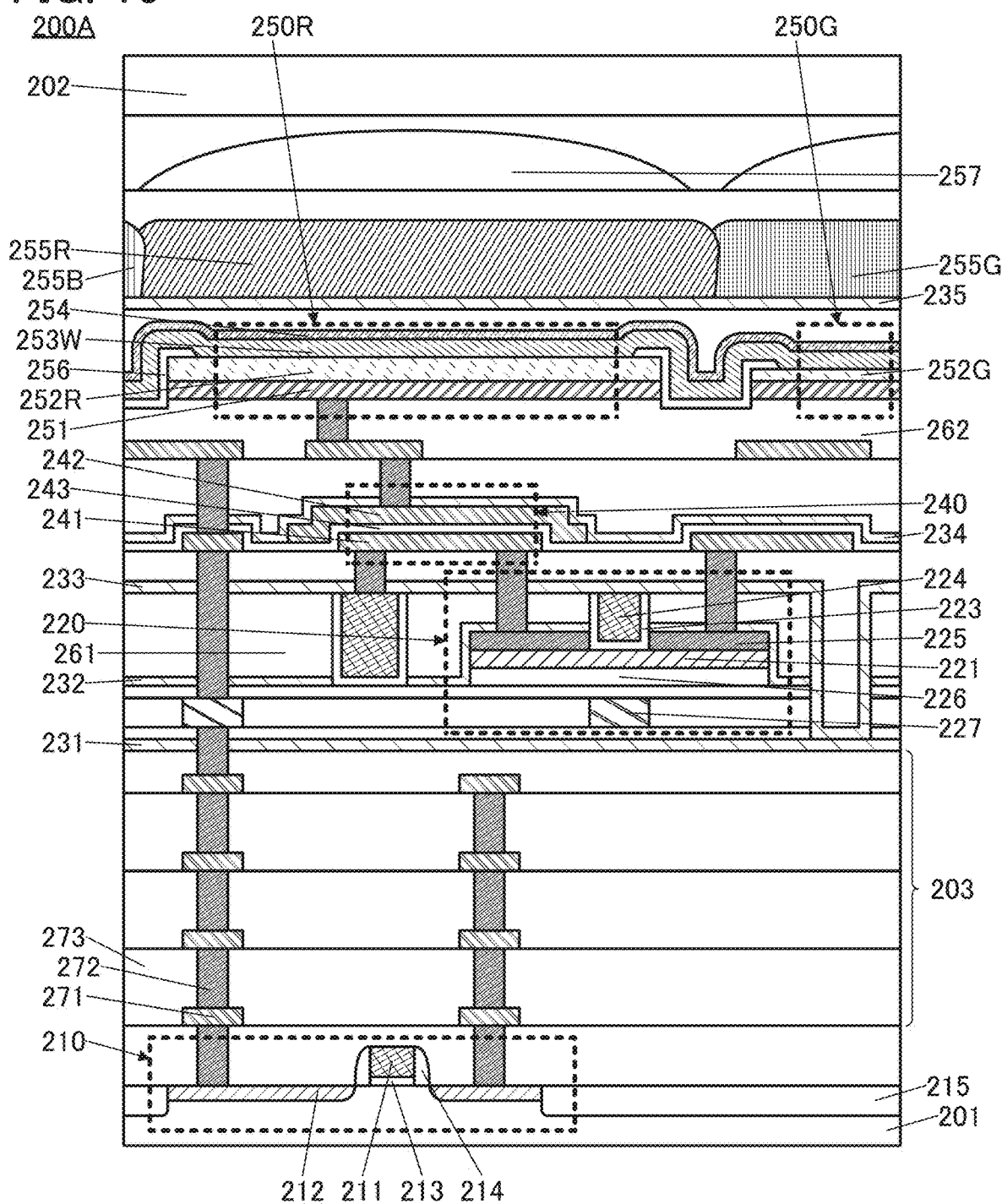
FIG. 13 illustrates a structure example of a display device.

FIG. 13 is a schematic cross-sectional view of a display device 200A. The display device 200A includes, between a substrate 201 and a substrate 202, a light-emitting element 250R, a light-emitting element 250G, a transistor 210, a transistor 220, a capacitor 240, and the like.

The transistor 210 is a transistor whose channel formation region is formed in the substrate 201. As the substrate 201, a semiconductor substrate such as a single crystal silicon substrate can be used, for example. The transistor 210 includes part of the substrate 201, a conductive layer 211, a low-resistance region 212, an insulating layer 213, an insulating layer 214, and the like. The conductive layer 211 functions as a gate electrode. The insulating layer 213 is positioned between the substrate 201 and the conductive layer 211 and functions as a gate insulating layer. The low-resistance region 212 is a region where the substrate 201 is doped with an impurity, and functions as one of a source and a drain. The insulating layer 214 is provided to cover a side surface of the conductive layer 211 and functions as an insulating layer.

An element isolation layer 215 is provided between two adjacent transistors 210 to be embedded in the substrate 201.

A wiring layer 203 is provided between the transistor 210 and the transistor 220. The wiring layer 203 has a structure in which layers each including one or more wirings are stacked. Each of the layers includes a conductive layer 271, and an interlayer insulating layer 273 is provided between the layers. Furthermore, the conductive layers 271 of different layers are electrically connected to one another with plugs 272 provided in the interlayer insulating layers 273.

The transistor 220 is provided over the wiring layer 203. The transistor 220 contains a metal oxide (also referred to as an oxide semiconductor) in the semiconductor layer where a channel is formed.

The transistor 220 includes a semiconductor layer 221, an insulating layer 223, a conductive layer 224, a pair of conductive layers 225, an insulating layer 226, a conductive layer 227, and the like.

An insulating layer 231 is provided over the wiring layer 203. The insulating layer 231 functions as a barrier layer that prevents diffusion of impurities such as water and hydrogen from the wiring layer 203 side into the transistor 220 and release of oxygen from the semiconductor layer 221 to the wiring layer 203 side. As insulating layer 231, for example, a film in which hydrogen or oxygen is less likely to diffuse than in a silicon oxide film can be used. Examples of such a film include an aluminum oxide film, a hafnium oxide film, and a silicon nitride film.

The conductive layer 227 is provided over the insulating layer 231, and the insulating layer 226 is provided to cover the conductive layer 227. The conductive layer 227 functions as a first gate electrode of the transistor 220, and part of the insulating layer 226 functions as a first gate insulating layer. An oxide insulating film such as a silicon oxide film is preferably used as at least part of the insulating layer 226 that is in contact with the semiconductor layer 221.

The insulating layer 226 is provided over the semiconductor layer 221. A metal oxide film having semiconductor characteristics (also referred to as an oxide semiconductor film) is preferably used as the semiconductor layer 221.

When the semiconductor layer 221 is an In-M-Zn oxide, as the atomic ratio of metal elements in a sputtering target used for deposition of the In-M-Zn oxide, In:M:Zn=1:1:1, In:M:Zn=1:1:1.2, In:M:Zn=1:3:2, In:M:Zn=1:3:4, In:M:Zn=1:3:6, In:M:Zn=2:2:1, In:M:Zn=2:1:3, In:M:Zn=3:1:2, In:M:Zn=4:2:3, In:M:Zn=4:2:4.1, In:M:Zn=5:1:3, In:M:Zn=5:1:6, InM:Zn=5:1:7, In:M:Zn=5:1:8, In:M:Zn=6:1:6, In:M:Zn=5:2:5, or the like is given.

The sputtering target preferably contains a polycrystalline oxide, in which case the semiconductor layer 221 having crystallinity is easily formed. Note that the atomic ratio in the deposited semiconductor layer 221 varies within the range of ±40% from any of the atomic ratios of the metal elements contained in the sputtering target. For example, in the case where the composition of the sputtering target used for the semiconductor layer 221 is In:Ga:Zn=4:2:4.1 [atomic ratio], the composition of the deposited semiconductor layer is in the neighborhood of In:Ga:Zn=4:2:3 [atomic ratio] in some cases.

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The energy gap of the semiconductor layer 221 is 2 eV or more, preferably 2.5 eV or more. Thus, with the use of a metal oxide having a wider energy gap than silicon, the off-state current of the transistor can be reduced.

The semiconductor layer 221 preferably has a non-single-crystal structure. The non-single-crystal structure includes, for example, a CAAC structure which is described later, a polycrystalline structure, a microcrystalline structure, and an amorphous structure. Among the non-single-crystal structures, the amorphous structure has the highest density of defect states, whereas the CAAC structure has the lowest density of defect states.

A c-axis aligned crystal (CAAC) will be described below. A CAAC refers to an example of a crystal structure.

Note that the CAAC structure is a crystal structure of a thin film or the like that has a plurality of nanocrystals (crystal regions each of which has a maximum diameter of less than 10 nm). The nanocrystals each have c-axis alignment in a particular direction. The nanocrystals each have neither a-axis alignment nor b-axis alignment, and have continuous crystal connection without a grain boundary in the a-axis and b-axis directions. In particular, in a thin film having the CAAC structure, the c-axes of nanocrystals are likely to be aligned in the film thickness direction, the normal direction of the surface where the thin film is formed, or the normal direction of the surface of the thin film.

A c-axis aligned crystal oxide semiconductor (CAAC-OS) is an oxide semiconductor with high crystallinity. On the other hand, in the CAAC-OS, a clear grain boundary cannot be observed; thus, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability.

Here, in crystallography, a general way of choosing a unit cell formed with three axes (crystal axes) of the a-axis, the b-axis, and the c-axis is to choose a unit cell in which a unique axis is used as the c-axis. In particular, in the case of a crystal having a layered structure, a general way of choosing a unit cell is to choose a unit cell in which two axes parallel to the plane direction of a layer are used as the a-axis and the b-axis and an axis intersecting with the layer is used as the c-axis. Typical examples of such a crystal having a layered structure include graphite, which is classified as a hexagonal system. In a unit cell of graphite, the a-axis and the b-axis are parallel to the cleavage plane and the c-axis is orthogonal to the cleavage plane. For example, an InGaZnO$_4$ crystal having a YbFe$_2$O$_4$ type crystal structure, which is a layered structure, can be classified as a hexagonal system, and, in a unit cell thereof, the a-axis and the b-axis are parallel to the plane direction of the layer and the c-axis is orthogonal to the layer (i.e., orthogonal to the a-axis and the b-axis).

In an image obtained with a TEM, crystal parts cannot be found clearly in an oxide semiconductor film having a microcrystalline structure (a microcrystalline oxide semiconductor film) in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or greater than or equal to 1 nm and less than or equal to 3 nm is specifically referred to as a nanocrystal (nc). An oxide semiconductor film including a nanocrystal is referred to as a nanocrystalline oxide semiconductor (nc-OS) film. In an image obtained with a TEM, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Hence, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak indicating a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, in some cases, a circular (ring-like) region with high luminance is observed in an electron diffraction pattern (also referred to as nanobeam electron diffraction pattern) of the nc-OS film, which is obtained using an electron beam with a probe diameter close to or smaller than the diameter of a crystal part (e.g., 1 nm or larger and 30 nm or smaller), and spots are observed in the ring-like region.

The nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film. Thus, the nc-OS film has a higher carrier density and higher electron mobility than the CAAC-OS film in some cases. Accordingly, a transistor including the nc-OS film may have high field-effect mobility.

The nc-OS film can be formed at a smaller oxygen flow rate ratio in deposition than the CAAC-OS film. The nc-OS film can also be formed at a lower substrate temperature in formation than the CAAC-OS film. For example, the nc-OS film can be deposited at a relatively low substrate temperature (e.g., 130° C. or lower) or without heating of the substrate; thus, the nc-OS film is suitable for the case of using a large glass substrate, a resin substrate, or the like, and productivity can be increased.

An example of a crystal structure of a metal oxide is described. A metal oxide that is formed by a sputtering method using an In—Ga—Zn oxide target (atomic ratio of In:Ga:Zn=4:2:4.1) at a substrate temperature higher than or equal to 100° C. and lower than or equal to 130° C. is likely to have either the nc structure or the CAAC structure, or a structure in which both structures are mixed. In contrast, a metal oxide formed at a substrate temperature set at room temperature (R.T.) is likely to have the nc structure. Note that room temperature (R.T.) herein also refers to a temperature of the time when a substrate is not heated intentionally.

The pair of conductive layers 225 is provided on and in contact with the semiconductor layer 221, and functions as a source electrode and a drain electrode.

An insulating layer 232 is provided to cover top and side surfaces of the pair of conductive layers 225, a side surface of the semiconductor layer 221, and the like, and an insulating layer 261 is provided over the insulating layer 232. The insulating layer 232 functions as a barrier layer that prevents diffusion of impurities such as water and hydrogen from the interlayer insulating layer and the like into the semiconductor layer 221 and release of oxygen from the semiconductor layer 221. As the insulating layer 232, an insulating film similar to the insulating layer 231 can be used.

An opening reaching the semiconductor layer 221 is provided in the insulating layers 232 and 261. The insulating layer 223 that is in contact with the side surfaces of the insulating layers 261 and 232, the side surface of the conductive layer 225, and the top surface of the semiconductor layer 221 and the conductive layer 224 over the insulating layer 223 are embedded in the opening. The conductive layer 224 functions as a second gate electrode, and the insulating layer 223 functions as a second gate insulating layer.

The top surface of the conductive layer 224, the top surface of the insulating layer 223, and the top surface of the insulating layer 261 are planarized so that they are substantially level with each other, and an insulating layer 233 is provided to cover these layers. An opening portion is provided in the stacked-layer structure between the insulating layer 233 and the insulating layer 231, and part of the insulating layer 233 is in contact with the insulating layer 231 in the opening portion. The insulating layer 261 functions as an interlayer insulating layer. The insulating layer 233 functions as a barrier layer that prevents diffusion of impurities such as water and hydrogen from layers above the insulating layer 233. As the insulating layer 233, an insulating film similar to the insulating layer 231 or the like can be used.

The capacitor 240 is provided over the insulating layer 233.

The capacitor 240 includes a conductive layer 241, a conductive layer 242, and an insulating layer 243 between the conductive layers 241 and 242. The conductive layer 241 functions as one electrode of the capacitor 240, the conductive layer 242 functions as the other electrode of the capacitor 240, and the insulating layer 243 functions as a dielectric of the capacitor 240.

An insulating layer 234 is provided to cover the capacitor 240. As the insulating layer 234, an insulating film similar to the insulating layer 231 can be used. An insulating layer 262 is provided over the insulating layer 231 with an interlayer insulating layer and a wiring positioned therebetween, and the light-emitting elements 250R and 250G are provided over the insulating layer 262.

The light-emitting element 250R includes a conductive layer 251, a conductive layer 252R, an EL layer 253W, a conductive layer 254, and the like.

The conductive layer 251 has a property of reflecting visible light, and the conductive layer 252R has a property of transmitting visible light. The conductive layer 254 has a property of reflecting and transmitting visible light. The conductive layer 252R functions as an optical adjustment layer for adjusting the optical path length between the conductive layer 251 and the conductive layer 254. The thickness of the optical adjustment layer can differ between the light-emitting elements of different colors. The thickness of the conductive layer 252R of the light-emitting element 250R is different from the thickness of a conductive layer 252G of the light-emitting element 250G.

An insulating layer 256 is provided to cover an end portion of the conductive layer 252R and an end portion of the conductive layer 252G.

The EL layer 253W and the conductive layer 254 are shared by a plurality of pixels. The EL layer 253W includes a light-emitting layer that emits white light.

A coloring layer 255R is provided over the light-emitting element 250R with an insulating layer 235 positioned therebetween. A coloring layer 255G is provided over the light-emitting element 250G. Note that part of a coloring layer 255B is shown in FIG. 13.

The coloring layer 255R transmits red light, the coloring layer 255G transmits green light, and the coloring layer 255B transmits blue light, for example. This can increase the color purity of light from the light-emitting elements, so that a display device with higher display quality can be achieved. Furthermore, positional alignment of the light-emitting elements and the coloring layers is easier in the case where the coloring layers are formed over the insulating layer 235 than in the case where the coloring layers are formed on the substrate 202 side and then the substrates 201 and 202 are bonded to each other; therefore, a display device with extremely high resolution can be achieved.

A lens array 257 is provided over the coloring layers 255R and 255G. Light emitted from the light-emitting element 250R is colored by the coloring layer 255R and is emitted to the outside through the lens array 257. The lens array 257 may be omitted if not needed.

The display device 200A includes the substrate 202 on the viewing side. The substrate 202 and the substrate 201 are bonded to each other. As the substrate 202, a light-transmitting substrate such as a glass substrate, a quartz substrate, a sapphire substrate, or a plastic substrate can be used.

With such a structure, a display device with extremely high resolution and high display quality can be achieved.

Figure 14:
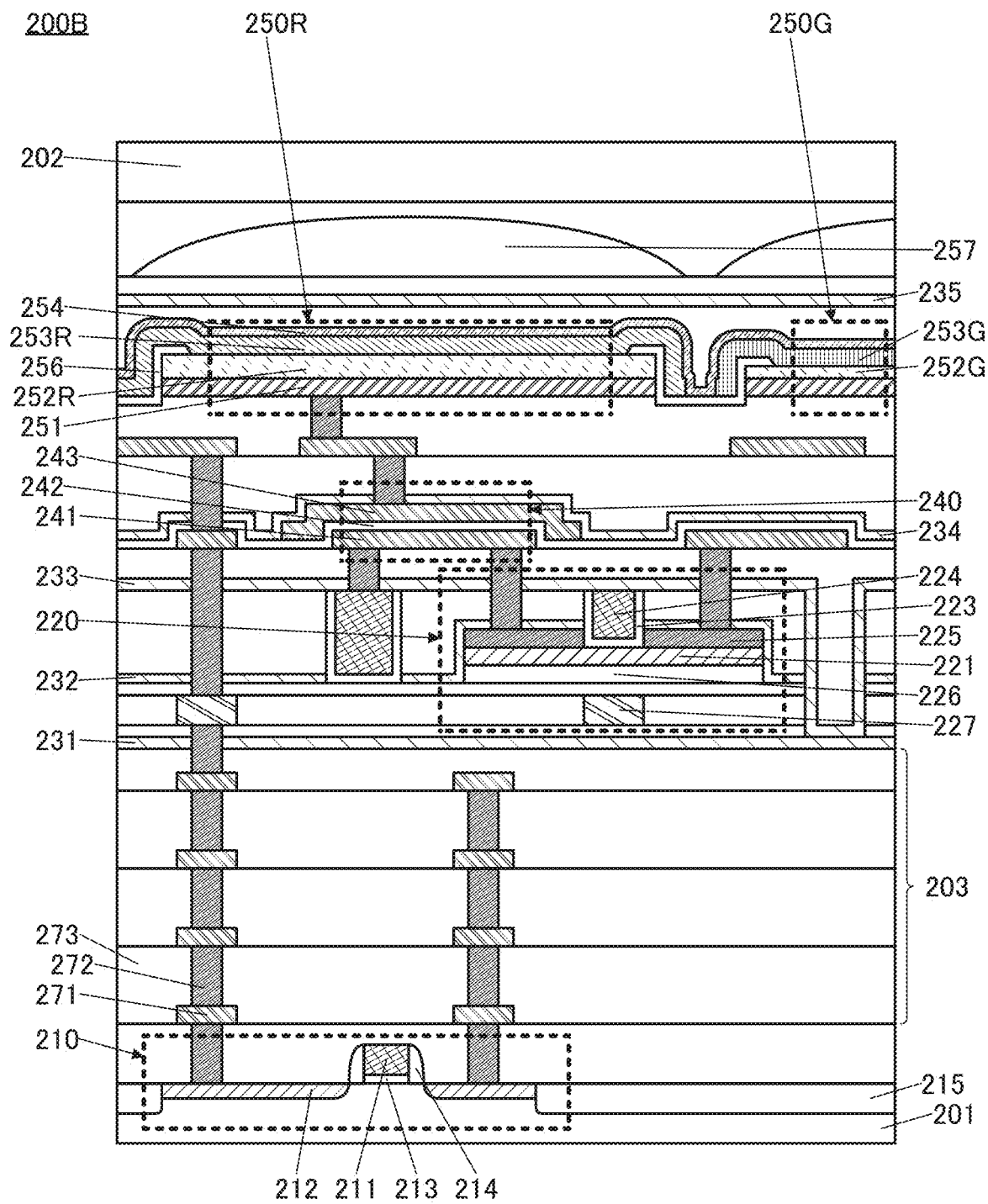
FIG. 14 illustrates a structure example of a display device.

FIG. 14 illustrates a schematic cross-sectional view of a display device 200B with a structure partly different from that of the display device 200A.

The light-emitting element 250R includes an EL layer 253R that emits red light. The light-emitting element 250G includes an EL layer 253G that emits green light.

In the example described here, the display device 200B includes no coloring layer.

In addition, the EL layer 253R and the EL layer 253G are processed so as not to be in contact with each other between adjacent two light-emitting elements. In other words, between the adjacent two light-emitting elements, an end portion of the EL layer 253R and an end portion of the EL layer 253G are provided to face each other over the insulating layer 256. Although the EL layer 253R and the EL layer 253G may be formed separately by an evaporation method using a fine metal mask, they are each preferably processed finely by a photolithography method.

The above is the description of the example of the cross-sectional structure.

[Protection Circuit]

A structure example of a protection circuit that can be used in the display device will be described below.

Many source lines and gate lines are arranged in a matrix in an active matrix display device. Therefore, when electrostatic discharge (ESD) is generated in the source line or the gate line during a manufacturing process of the display device, an integration process of an electronic device, or the like, display defects are caused. Thus, a protection circuit for reducing the influence of ESD is preferably provided for the source lines and the gate lines.

In addition, an inspection circuit, terminal, electrode, or the like for checking whether pixels drive normally is sometimes used in an inspection such as a pre-shipment inspection of a display device or a sampling inspection.

Figure 15A:
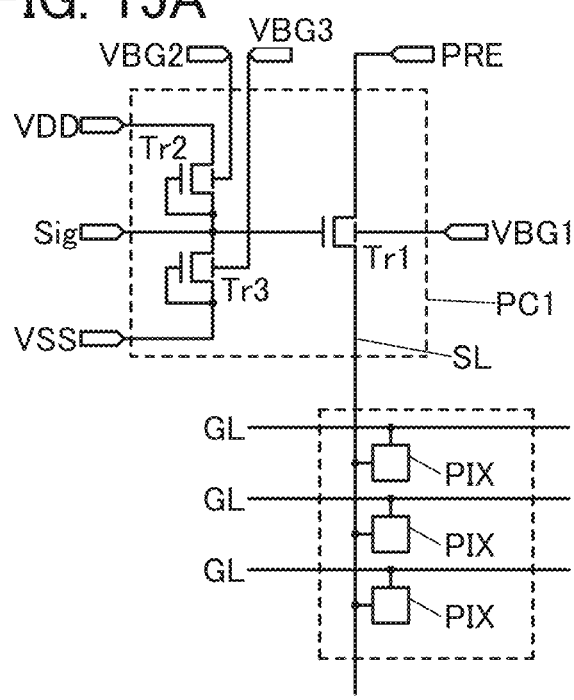
FIGS. 15A to 15D are circuit diagrams each illustrating a structure example of a protection circuit.

FIG. 15A illustrates a circuit PC1 for inputting a potential input from a terminal PRE to a source line SL, as an example.

The circuit PC1 includes a transistor Tr1, a transistor Tr2, and a transistor Tr3. Each of the transistors includes a pair of gates. A gate positioned below the semiconductor layer is referred to as a back gate, and a gate positioned above the semiconductor layer is referred to as a top gate.

A top gate of the transistor Tr1 is electrically connected to a terminal Sig, a back gate of the transistor Tr1 is electrically connected to a terminal VBG1, one of a source and a drain of the transistor Tr1 is electrically connected to the source line SL, and the other thereof is electrically connected to the terminal PRE.

The terminal Sig is supplied with a signal for controlling the transistor Tr1. The terminal VBG1 is supplied with a bias potential. When the transistor Tr1 is turned on, the wiring SL is supplied with the potential of the terminal PRE.

Here, the transistors Tr2 and Tr3 are electrically connected to each other between the top gate of the transistor Tr1 and the terminal Sig. The transistors Tr2 and Tr3 function as a protection circuit. The transistors Tr2 and Tr3 are each a diode-connected transistor. A terminal VDD is electrically connected to the transistor Tr2, and a terminal VSS is electrically connected to the transistor Tr3. A terminal VBG2 is electrically connected to a back gate of the transistor Tr2, and a terminal VBG3 is electrically connected to a back gate of the transistor Tr3.

Figure 15B:
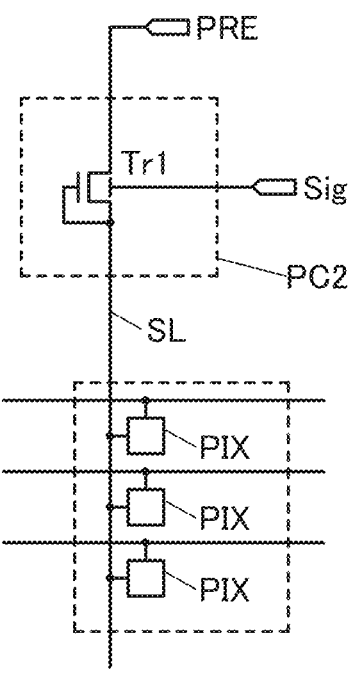

A circuit PC2 illustrated in FIG. 15B is an example in the case where the number of terminals and the number of transistors are reduced compared with those in the circuit PC1.

The circuit PC2 includes the transistor Tr1. The top gate of the transistor Tr1 is electrically connected to the wiring SL, the back gate of the transistor Tr1 is electrically connected to the terminal Sig, one of the source and the drain of the transistor Tr1 is electrically connected to the terminal PRE, and the other thereof is electrically connected to the wiring SL.

In this manner, the terminal Sig supplied with a control signal is connected not to the top gate of the transistor Tr1 but to the back gate of the transistor Tr1, whereby the terminal Sig does not require any protection circuit and thus the circuit can be simplified. Note that the top gate and the back gate of the transistor Tr1 can be interchanged in some cases depending on the electrical characteristics of the transistor Tr1.

Figure 15C:
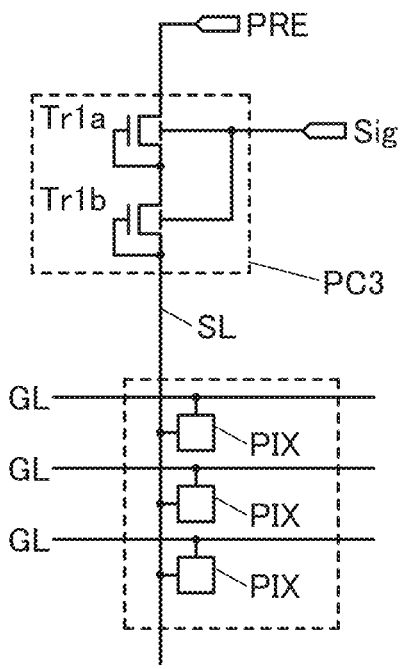

A circuit PC3 illustrated in FIG. 15C is an example in the case where two transistors, transistors Tr1a and Tr1b, are used instead of the transistor Tr1 in the circuit PC2. Back gates of the transistors Tr1a and Tr1b are electrically connected to the terminal Sig.

Figure 15D:
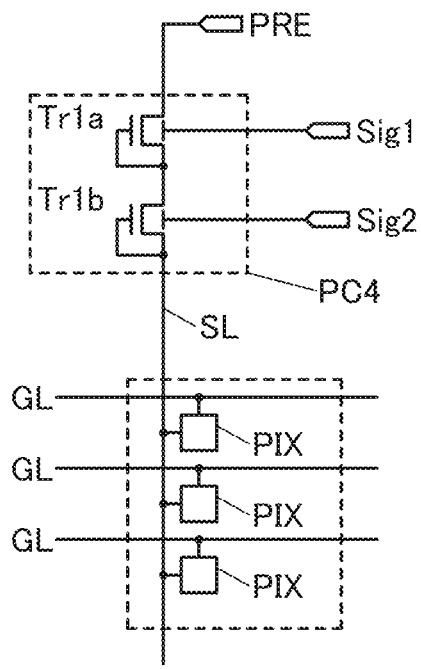

A circuit PC4 illustrated in FIG. 15D is an example in the case where terminals (a terminal Sig1 and a terminal Sig2) are connected to the transistor Tr1a and the transistor Tr1b, respectively.

With any of the structures illustrated in FIGS. 15B, 15C, and 15D, the number of terminals can be reduced greatly; therefore, a small display device can be achieved.

At least part of this embodiment can be implemented in appropriate combination with any of the other embodiments described in this specification.

Embodiment 2

In this embodiment, a display device and a display system that are embodiments of the present invention will be described.

<Structure Example of Display Device>

Figure 16:
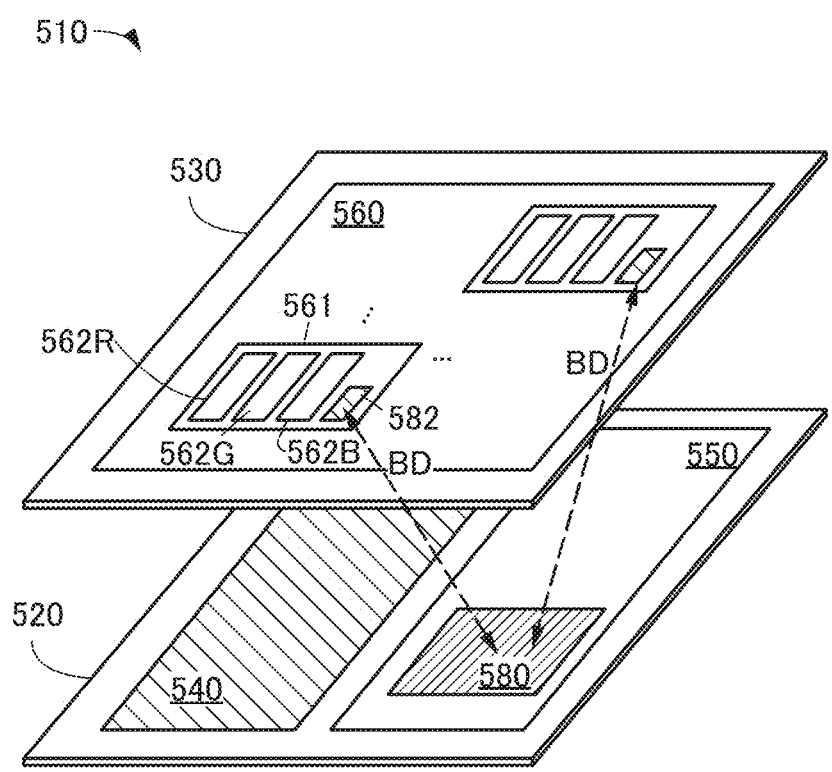
FIG. 16 is a block diagram illustrating a structure example of a display device.

FIG. 16 is a block diagram schematically illustrating a structure example of a display device 510 that is the display device of one embodiment of the present invention. The display device 510 includes a layer 520 and a layer 530. The layer 530 can be stacked above the layer 520, for example. An interlayer insulator or a conductor for electrical connection between different layers can be provided between the layers 520 and 530.

For example, a transistor provided in the layer 520 can be a transistor in which a channel formation region includes silicon (also referred to as a Si transistor) and can be a transistor in which a channel formation region includes single crystal silicon. In particular, a transistor in which a channel formation region includes single crystal silicon is preferably used as the transistor provided in the layer 520, in which case the on-state current of the transistor can be high, so that a circuit included in the layer 520 can be driven at high speed. The Si transistor can be formed by minute processing with a channel length of 3 nm to 10 nm;

therefore, the display device 510 can be provided with a CPU, an accelerator such as a GPU, an application processor, or the like.

A transistor provided in the layer 530 can be an OS transistor, for example. It is particularly preferable that a transistor in which a channel formation region includes an oxide containing at least one of indium, an element M (the element M is aluminum, gallium, yttrium, or tin), and zinc be used as the OS transistor. Such an OS transistor has a characteristic of an extremely low off-state current. Thus, it is preferable that the OS transistor be used as a transistor provided particularly in a pixel circuit included in a display portion, in which case analog data written to the pixel circuit can be retained for a long time.

A driver circuit 540 and a functional circuit 550 are provided in the layer 520. Since the Si transistor with a high on-state current is provided in the layer 520, the circuits included in the layer 520 can be driven at high speed.

A display portion 560 including a plurality of pixels 561 is provided in the layer 530. Pixel circuits 562R, 562G, and 562B that control emission of red light, green light, and blue light are provided in the pixels 561. The pixel circuits 562R, 562G, and 562B function as subpixels of the pixels 561. Since the pixel circuits 562R, 562G, and 562B include OS transistors, analog data written to the pixel circuits can be retained for a long time. A backup circuit 582 is provided in each of the pixels 561 included in the layer 530. The backup circuit is sometimes referred to as a memory circuit.

The driver circuit 540 includes a gate line driver circuit, a source line driver circuit, and the like for driving the pixels 561 (the pixel circuits 562R, 562G, and 562B) in the display portion 560. The driver circuit 540 is provided not in the layer 530 where the display portion is provided but in the layer 520, whereby an area occupied by the display portion in the layer 530 can be large. In addition, the driver circuit 540 may include a digital-to-analog (D/A) converter circuit, a low voltage differential signaling (LVDS) circuit functioning as an interface for receiving data such as image data from the outside of the display device 510, or the like. The Si transistor of the layer 520 can have a high on-state current. The channel length, the channel width, or the like of the Si transistor may be varied in accordance with the operation speed of each circuit.

The functional circuit 550 includes a processor (e.g., a CPU) used for arithmetic processing of data. A CPU includes a plurality of CPU cores. A CPU core includes a flip-flop. A flip-flop includes a plurality of scan flip-flops. Input/output of data of the scan flip-flops (backup data) is performed between a flip-flop 580 and the backup circuit 582. FIG. 16 illustrates backup data BD as a data signal retained in the backup circuit 582.

For the backup circuit 582, for example, a memory including an OS transistor is suitable. The use of an OS transistor with an extremely low off-state current in the backup circuit leads to advantages such as long-time retention of the voltage of analog data written to the backup circuit and very little power consumption for data retention. The backup circuit 582 including the OS transistor can be provided in the display portion 560 where the plurality of pixels 561 is provided. FIG. 16 illustrates a state where the backup circuit 582 is provided in each of the pixels 561.

The backup circuits 582 including the OS transistor and the layer 520 including the Si transistor can be stacked. The backup circuits 582 may be arranged in a matrix like the subpixels in the pixels 561; alternatively, one backup circuit 582 may be provided for a plurality of pixels. That is, the backup circuits 582 can be arranged in the layer 530 without being limited by the arrangement of the pixels 561. Therefore, the backup circuits 582 can be arranged without any increase in the circuit area while the degree of flexibility in the layout of the display portion or the circuits is enhanced, so that memory capacity of the backup circuits 582 required for arithmetic processing can be increased.

<Structure Example of Pixel Circuit and Backup Circuit>

Figure 17:
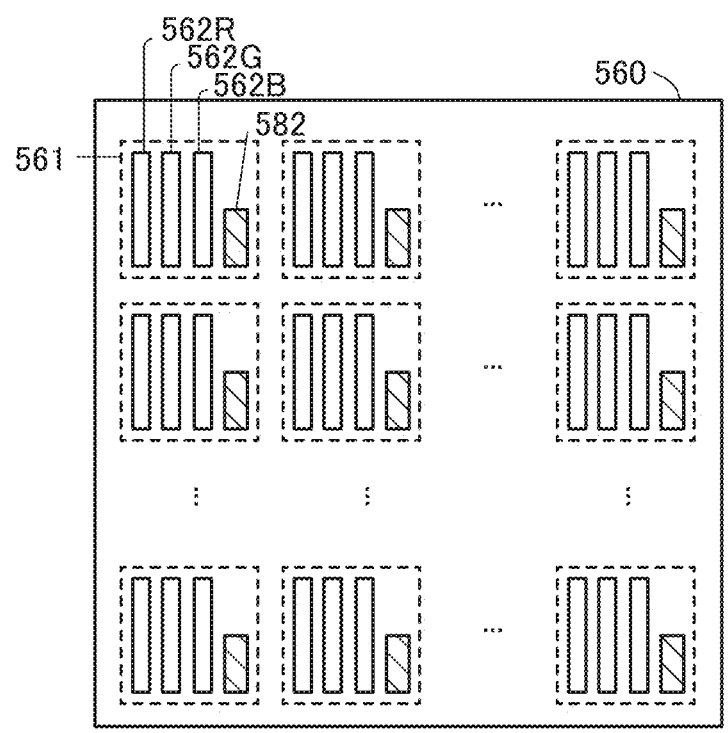
FIG. 17 is a block diagram illustrating a structure example of a display device.
Figure 18:
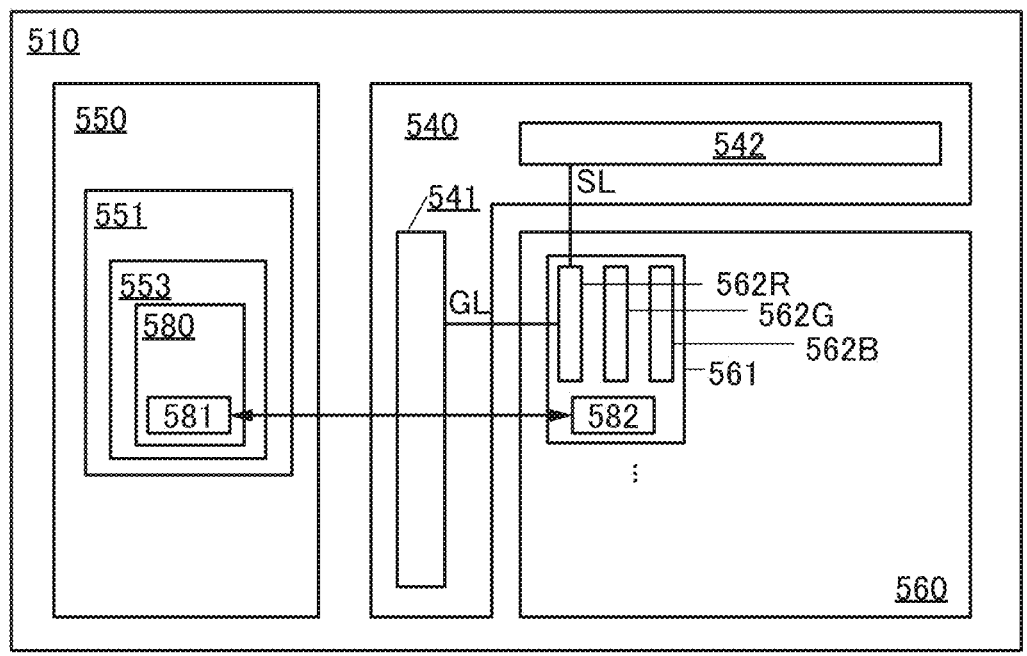
FIG. 18 is a block diagram illustrating a structure example of a display device.

FIG. 17 and FIG. 18 illustrate an example of the layout of the backup circuit 582 and the pixel circuits 562R, 562G, and 562B functioning as the subpixels in the display portion 560.

FIG. 17 illustrates a structure in which the pixels 561 are arranged in a matrix in the display portion 560. The pixels 561 each include the pixel circuits 562R, 562G, and 562B and the backup circuit 582. As described above, the backup circuit 582 and the pixel circuits 562R, 562G, and 562B can be formed with OS transistors and thus can be placed in the same pixel.

<Block Diagram of Display Device>

FIG. 18 is a block diagram illustrating components included in the display device 510. The display device includes the driver circuit 540, the functional circuit 550, and the display portion 560.

The driver circuit 540 includes a gate driver 541 and a source driver 542, for example. The gate driver 541 has a function of driving a plurality of gate lines GL for outputting signals to the pixel circuits 562R, 562G, and 562B. The source driver 542 has a function of driving a plurality of source lines SL for outputting signals to the pixel circuits 562R, 562G, and 562B. The driver circuit 540 supplies voltage for performing display with the pixel circuits 562R, 562G, and 562B to the pixel circuits 562R, 562G, and 562B through a plurality of wirings.

The functional circuit 550 includes a CPU 551. The CPU 551 includes a CPU core 553. The CPU core 553 includes the flip-flop 580 for temporarily retaining data used for arithmetic processing. The flip-flop 580 includes a plurality of scan flip-flops 581, and each of the scan flip-flops 581 is electrically connected to the backup circuit 582 provided in the display portion 560.

The display portion 560 includes the plurality of pixels 561 each including the pixel circuits 562R, 562G, and 562B and the backup circuit 582. The backup circuit 582 is not necessarily placed in the pixel 561 that is a repeating unit, as described with reference to FIG. 17. The backup circuit 582 can be placed freely in accordance with the shape of the display portion 560, the shapes of the pixel circuits 562R, 562G, and 562B, and the like.

<Structure Example of Pixel Circuit>

Figure 19A:
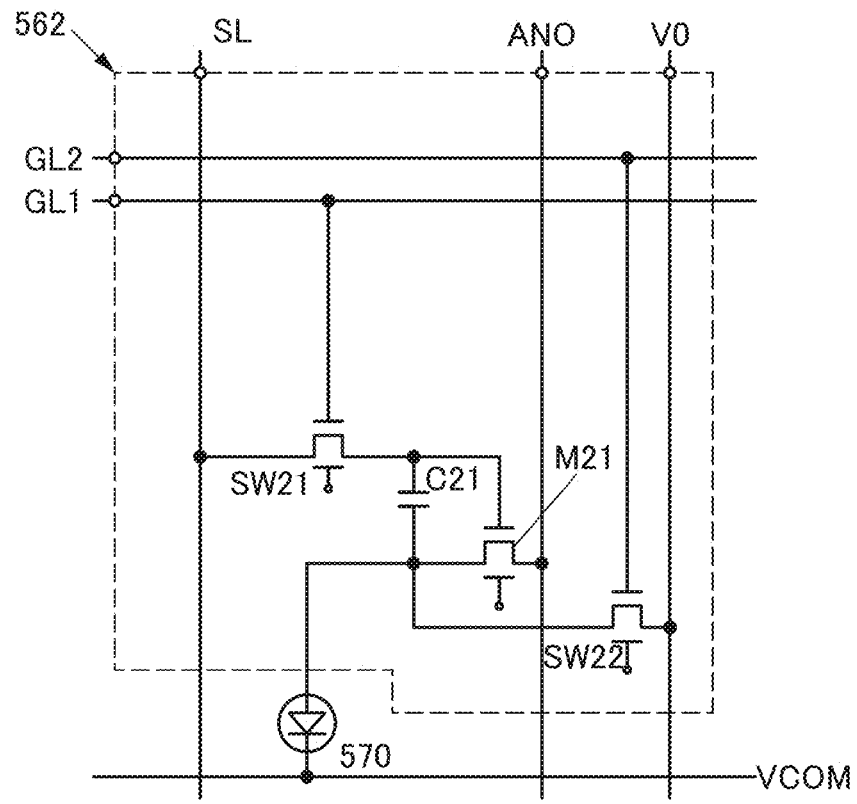
FIGS. 19A and 19B are circuit diagrams illustrating a structure example of a display device.
Figure 19B:
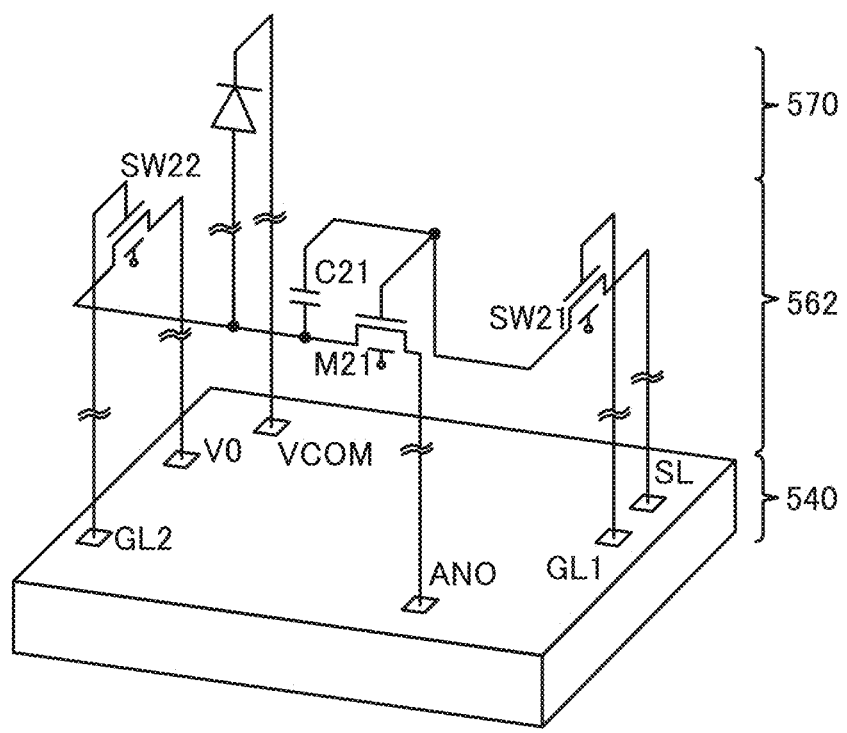

FIGS. 19A and 19B illustrate a structure example of a pixel circuit 562 that can be used as the pixel circuits 562R, 562G, and 562B and a light-emitting element 570 connected to the pixel circuit 562. FIG. 19A illustrates connection between elements, and FIG. 19B schematically illustrates the positional relationship of the driver circuit 540, the pixel circuit 562, and the light-emitting element 570.

In this specification and the like, the term "element" can be replaced with the term "device" in some cases. For example, a display element, a light-emitting element, and a liquid crystal element can be rephrased as a display device, a light-emitting device, and a liquid crystal device, respectively.

The pixel circuit 562, which is illustrated as an example in FIGS. 19A and 19B, includes a switch SW21, a switch SW22, a transistor M21, and a capacitor C21. The switch SW21, the switch SW22, and the transistor M21 can be formed with OS transistors. Each of the OS transistors of the switch SW21, the switch SW22, and the transistor M21 preferably includes both a gate electrode and a back gate electrode, in which case the back gate electrode and the gate electrode can be supplied with the same signals or different signals.

The transistor M21 includes the gate electrode electrically connected to the switch SW21, a first electrode electrically connected to the light-emitting element 570, and a second electrode electrically connected to a wiring ANO. The wiring ANO supplies a potential for supplying current to the light-emitting element 570.

The switch SW21 includes a first terminal electrically connected to the gate electrode of the transistor M21 and a second terminal electrically connected to the source line SL. Furthermore, the switch SW21 has a function of controlling its on/off state on the basis of the potential of a gate line GL1.

The switch SW22 includes a first terminal electrically connected to the wiring V0 and a second terminal electrically connected to the light-emitting element 570. In addition, the switch SW22 has a function of controlling its on/off state on the basis of the potential of a gate line GL2. The wiring V0 supplies a reference potential and outputs current flowing in the pixel circuit 562 to the driver circuit 540 or the functional circuit 550.

The capacitor C21 includes a conductive film electrically connected to the gate electrode of the transistor M21 and a conductive film electrically connected to the second terminal of the switch SW22.

The light-emitting element 570 includes a first electrode electrically connected to the first electrode of the transistor M21 and a second electrode electrically connected to a wiring VCOM. A potential for supplying current to the light-emitting element 570 is supplied to the wiring VCOM.

Accordingly, the intensity of light emitted by the light-emitting element 570 can be controlled in accordance with an image signal supplied to the gate electrode of the transistor M21. Furthermore, the amount of current flowing to the light-emitting element 570 can be increased by the reference potential of the wiring V0 that is supplied through the switch SW22. Moreover, it is possible to estimate the amount of current flowing to the light-emitting element by monitoring the amount of current flowing to the wiring V0 with an external circuit. Thus, a defect of a pixel or the like can be detected.

In the structure illustrated as an example in FIG. 19B, the wirings electrically connecting the pixel circuit 562 and the driver circuit 540 can be made short, so that wiring resistance of the wirings can be small. Accordingly, data writing can be performed at high speed, and the display device 510 can be driven at high speed. Therefore, even when the number of pixels 561 included in the display device 510 is large, a sufficiently long frame period can be ensured and the pixel density of the display device 510 can be increased. In addition, the increased pixel density of the display device 510 can increase the definition of an image displayed by the display device 510. For example, the pixel density of the display device 510 can be 1000 ppi or higher, 5000 ppi or higher, or 7000 ppi or higher. Thus, the display device 510 can be, for example, a display device for VR or AR and can be suitably used in an electronic device with a short distance between the display portion and the user, such as an HMD.

Although the gate line GL1, the gate line GL2, the wiring ANO, the wiring VCOM, the wiring V0, and the source line SL are supplied with signals from the driver circuit 540 below the pixel circuit 562 through the wirings in FIG. 19B, one embodiment of the present invention is not limited thereto. For example, wirings for supplying signals and voltages of the driver circuit 540 may be led to an outer region of the display portion 560 and electrically connected to the pixel circuits 562 arranged in a matrix in the layer 530. In this case, it is effective that the gate driver 541 included in the driver circuit 540 is provided in the layer 530. That is, the use of OS transistors as transistors of the gate driver 541 is effective. It is effective that part of the function of the source driver 542 included in the driver circuit 540 is provided in the layer 530. For example, it is effective that a demultiplexer distributing signals output by the source driver 542 to source lines is provided in the layer 530. The use of OS transistors as transistors of the demultiplexer is effective.

<Structure Example of Display Correction System>

The display system of one embodiment of the present invention may include a display correction system. The display correction system can reduce display defects based on defective pixels, such as bright spots or dark spots, by correcting a current $I_{EL}$ flowing to the light-emitting elements 570.

Figure 20A:
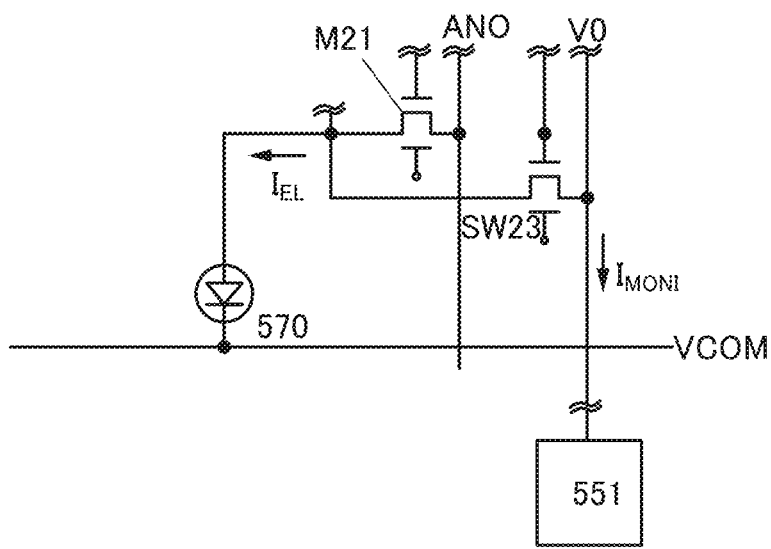
FIGS. 20A to 20C are a circuit diagram and schematic views illustrating structure examples of a display device.

A circuit diagram in FIG. 20A illustrates part of the pixel circuit 562 illustrated in FIG. 19A. The amount of the current $I_{EL}$ flowing to the light-emitting element 570 in a defective pixel causing a bright spot or a dark spot is extremely larger or smaller than that in a pixel that performs normal display.

Figure 20B:
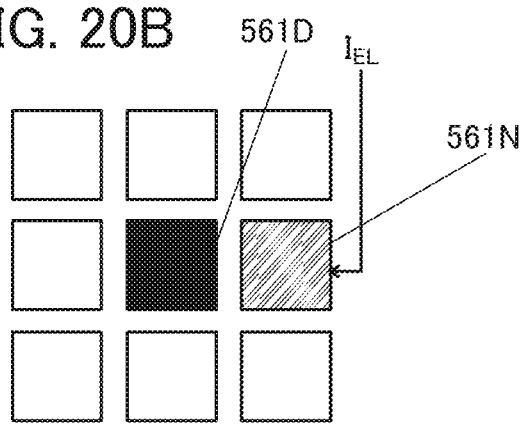
Figure 20C:
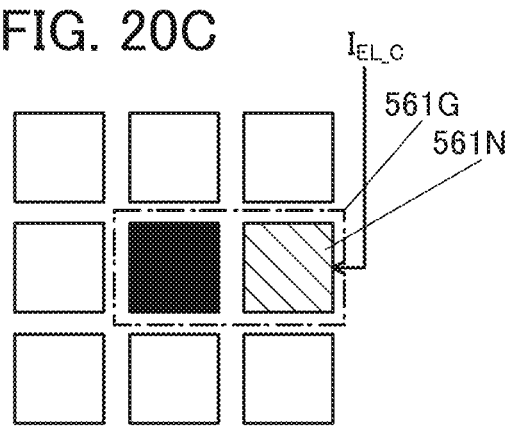

The CPU 551 periodically obtains data of a monitor current $I_{MONI}$ that flows through a switch SW23. The amount of the monitor current $I_{MONI}$ is converted into digital data that can be treated in the CPU 551 and arithmetic processing is performed in the CPU 551 with the digital data. A defective pixel is presumed by the arithmetic processing in the CPU 551, and correction is performed in the CPU 551 so that a display defect due to the defective pixel is less likely to be seen. For example, in the case where a pixel 561D illustrated in FIG. 20B is a defective pixel, the current $I_{EL}$ that flows to the light-emitting element 570 of an adjacent pixel 561N is corrected.

The amount of the correction can be estimated by executing arithmetic operation based on an artificial neural network such as a deep neural network (DNN), a convolutional neural network (CNN), a recurrent neural network (RNN), an autoencoder, a deep Boltzmann machine (DBM), or a deep belief network (DBN).

With the above correction, the current $I_{EL}$ flowing to the pixel 561N adjacent to the defective pixel is corrected to be a current $I_{EL\_C}$. When a composited pixel 561G of the defective pixel and the pixel 561N performs display, a display defect due to the defective pixel, such as a bright spot or a dark spot, can be less likely to be seen, leading to normal display.

Note that during arithmetic operation by the display correction system, which is performed for correcting a current flowing to a pixel, data in the arithmetic operation can be retained as backup data. Therefore, the display correction system is particularly effective in arithmetic processing on an enormous amount of calculation, such as arithmetic operation based on an artificial neural network. Note that it is also possible to reduce power consumption in addition to a reduction in display defects by making the CPU 551 function as an application processor and combining arithmetic operation with, for example, driving that makes a frame frequency changeable.

<Modification Example of Display Device>

Figure 21:
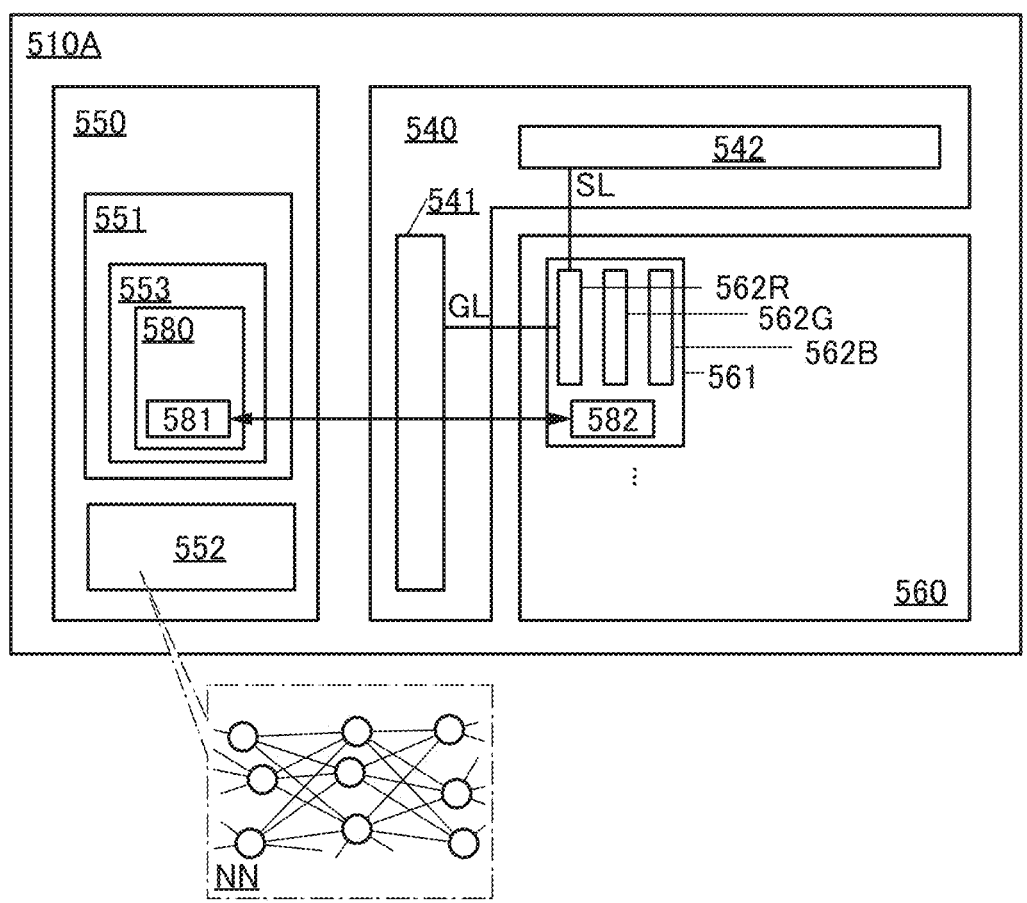
FIG. 21 is a block diagram illustrating a structure example of a display device.

FIG. 21 illustrates a modification example of the components included in the display device 510 described above.

The structure of a block diagram of a display device 510A illustrated in FIG. 21 corresponds to the structure of the display device 510 in FIG. 18 in which an accelerator 552 is added to the functional circuit 550.

In the case where arithmetic operation based on an artificial neural network is performed in the above-described display correction system, product-sum operation is repeatedly performed. The accelerator 552 functions as a dedicated arithmetic circuit to product-sum operation of an artificial neural network NN. In the arithmetic operation with the accelerator 552, the above-mentioned processing for correcting display defects or processing for correcting the outline of an image by upconversion of display data or the like can be performed, for example. During the arithmetic processing with the accelerator 552, it is possible to reduce the power consumption by power gating control on the CPU 551.

At least part of any of the structure examples, the drawings corresponding thereto, and the like described in this embodiment can be implemented in combination with any of the other structure examples, the other drawings corresponding thereto, and the like as appropriate.

Embodiment 3

In this embodiment, a light-emitting element (light-emitting device) that can be used in the display device of one embodiment of the present invention will be described.

In this specification and the like, a device fabricated using a metal mask or a fine metal mask (FMM, a high-resolution metal mask) is referred to as a device with a metal mask (MM) structure in some cases. Also in this specification and the like, a device fabricated without using a metal mask or an FMM is referred to as a device with a metal maskless (MML) structure in some cases.

Note that in this specification and the like, a structure in which light-emitting layers of light-emitting devices of different colors (here, blue (B), green (G), and red (R)) are separately formed or are colored separately is referred to as a side-by-side (SBS) structure in some cases. Furthermore, in this specification and the like, a light-emitting device capable of emitting white light is referred to as a white light-emitting device in some cases. Note that a white light-emitting device that is combined with coloring layers (e.g., color filters) can be a light-emitting device of full-color display.

Light-emitting devices can be roughly classified into a light-emitting device with a single structure and a light-emitting device with a tandem structure. A light-emitting device with a single structure includes one light-emitting unit between a pair of electrodes, and the light-emitting unit preferably includes one or more light-emitting layers. To obtain white light emission, two or more light-emitting layers need to be selected so as to emit light of complementary colors. When, for example, the emission colors of first and second light-emitting layers are made complementary, the light-emitting device as a whole can emit white light. The same applies to a light-emitting device including three or more light-emitting layers.

A light-emitting device with a tandem structure includes two or more light-emitting units between a pair of electrode, and each light-emitting unit preferably includes one or more light-emitting layers. To obtain white light emission, the structure is made so that light from light-emitting layers of the light-emitting units can be combined to be white light. Note that the structure that provides white light emission is similar to that in the case of the above-described single structure. In the light-emitting device with a tandem structure, it is preferable that an intermediate layer such as a charge-generation layer be provided between the plurality of light-emitting units.

A light-emitting device with an SBS structure can have lower power consumption than the white light-emitting device (with a single structure or a tandem structure). In order to reduce power consumption, it is preferable to use a light-emitting device with an SBS structure. Meanwhile, since the manufacturing process of the white light-emitting device is simpler than that of the light-emitting device with an SBS structure, the white light-emitting device is preferable to reduce the manufacturing cost or increase the manufacturing yield.

<Structure Example of Light-Emitting Element 570>

Figure 22A:
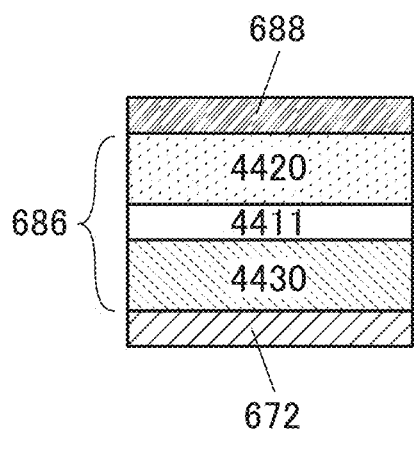
FIGS. 22A to 22C each illustrate a structure example of a light-emitting device.

An EL layer 686 included in the light-emitting element 570 can be formed of a plurality of layers such as a layer 4420, a light-emitting layer 4411, and a layer 4430, as illustrated in FIG. 22A. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 22A is referred to as a single structure in this specification.

Figure 22B:
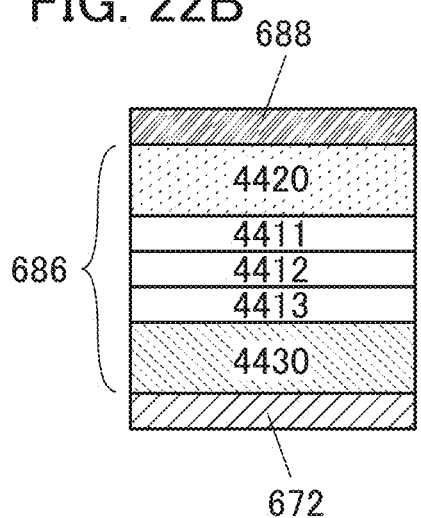

Note that the structure in which a plurality of light-emitting layers (light-emitting layers 4411, 4412, and 4413) is provided between the layer 4420 and the layer 4430 as illustrated in FIG. 22B is another variation of the single structure.

Figure 22C:
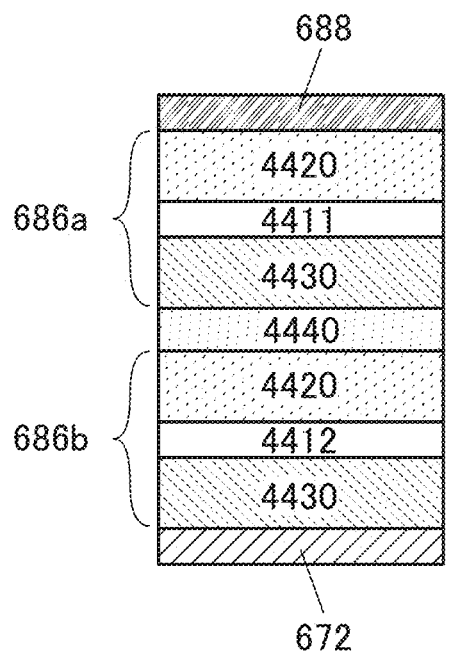

The structure in which a plurality of light-emitting units (El layers 686a and 686b) is connected in series with an intermediate layer (charge-generation layer) 4440 therebetween as illustrated in FIG. 22C is referred to as a tandem structure in this specification. In this specification and the like, the structure illustrated in FIG. 22C is referred to as a tandem structure; however, without being limited to this, a tandem structure may be referred to as a stack structure, for example. The tandem structure enables a light-emitting element capable of high luminance light emission.

The emission color of the light-emitting element 570 can be changed to red, green, blue, cyan, magenta, yellow, white, or the like depending on the material of the EL layer 686. When the light-emitting element 570 has a microcavity structure, the color purity can be further increased.

In the light-emitting element that emits white light, the light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that the light-emitting element can emit white light as a whole. This can be applied to a light-emitting element including three or more light-emitting layers.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

<Method for Forming Light-Emitting Element 570>

A method for forming the light-emitting element 570 provided over the pixel circuit 562 is described below.

Figure 23A:
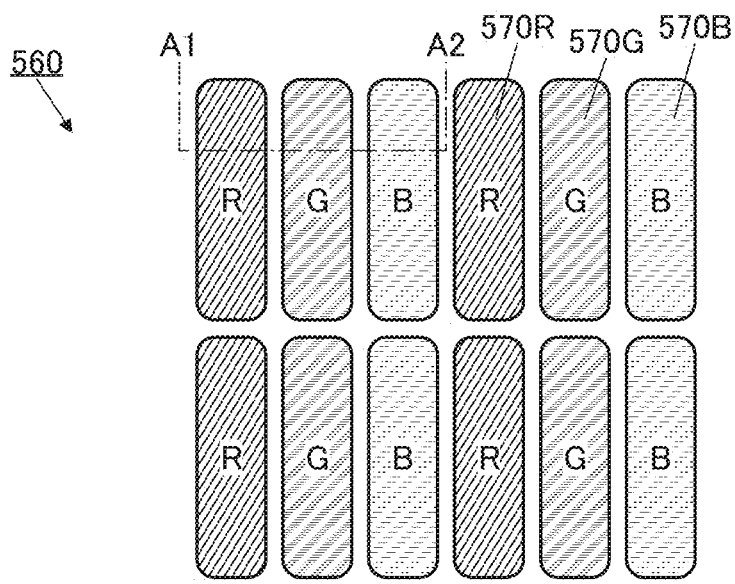
FIGS. 23A to 23C illustrate structure examples of a display device.

FIG. 23A illustrates a schematic top view of the display device of one embodiment of the present invention. The display portion 560 includes a plurality of light-emitting elements 570R exhibiting red, a plurality of light-emitting elements 570G exhibiting green, and a plurality of light-emitting elements 570B exhibiting blue. In FIG. 23A, light-emitting regions of the light-emitting elements are denoted by R, G, and B to easily differentiate the light-emitting elements. Note that the structure of the display portion 560 illustrated in FIG. 23A may be referred to as an SBS structure. Although the structure illustrated in FIG. 23A has three colors of red (R), green (G), and blue (B), one embodiment of the present invention is not limited thereto. For example, the structure may have four or more colors.

The light-emitting elements 570R, the light-emitting elements 570G, and the light-emitting elements 570B are arranged in a matrix. FIG. 23A shows what is called a stripe arrangement, in which the light-emitting elements with the same color are arranged in one direction. Note that the arrangement method of the light-emitting elements is not limited thereto; another method such as a delta, zigzag, or PenTile arrangement may also be used.

As the light-emitting elements 570R, 570G, and 570B, an organic EL device such as an organic light-emitting diode (OLED) or a quantum-dot light-emitting diode (QLED) is preferably used. As a light-emitting substance included in the EL element, a substance emitting fluorescence (a fluorescent material), a substance emitting phosphorescence (a phosphorescent material), a substance exhibiting thermally activated delayed fluorescence (a thermally activated delayed fluorescent (TADF) material), an inorganic compound (e.g., a quantum dot material), or the like can be used.

Figure 23B:
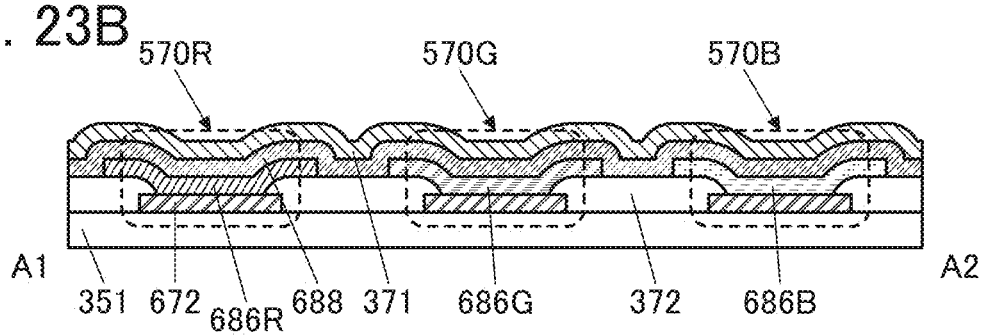

FIG. 23B is a schematic cross-sectional view taken along dashed-dotted line A1-A2 in FIG. 23A.

FIG. 23B shows a cross section of the light-emitting elements 570R, 570G, and 570B. The light-emitting elements 570R, 570G, and 570B are each provided over a substrate 351 and include a conductor 672 functioning a pixel electrode and a conductor 688 functioning a common electrode.

The light-emitting element 570R includes an EL layer 686R between the conductor 672 and the conductor 688. The EL layer 686R includes a light-emitting organic compound that emits light with intensity at least in a red wavelength range. An EL layer 686G of the light-emitting element 570G includes a light-emitting organic compound that emits light with intensity at least in a green wavelength range. An EL layer 686B of the light-emitting element 570B includes a light-emitting organic compound that emits light with intensity at least in a blue wavelength range.

The EL layer 686R, the EL layer 686G, and the EL layer 686B may each include one or more of an electron-injection layer, an electron-transport layer, a hole-injection layer, and a hole-transport layer in addition to the layer containing a light-emitting organic compound (the light-emitting layer).

The conductor 672 is provided for each of the light-emitting elements. The conductor 688 is provided as a common layer to the light-emitting elements. A conductive film that transmits visible light is used for either the conductor 672 or the conductor 688, and a reflective conductive film is used for the other. The light-transmitting conductor 672 and the reflective conductor 688 offer a bottom-emission display device whereas the reflective conductor 672 and the light-transmitting conductor 688 offer a top-emission display device. Note that when both the conductor 672 and the conductor 688 transmit light, a dual-emission display device can be obtained.

An insulating layer 372 is provided to cover end portions of the conductor 672. End portions of the insulating layer 372 are preferably tapered.

The EL layer 686R, the EL layer 686G, and the EL layer 686B each include a region in contact with a top surface of the conductor 672 and a region in contact with a surface of the insulating layer 372. End portions of the EL layer 686R, the EL layer 686G, and the EL layer 686B are positioned over the insulating layer 372.

As shown in FIG. 23B, there is a gap between the EL layers of two light-emitting elements with different colors. The EL layer 686R, the EL layer 686G, and the EL layer 686B are thus preferably provided so as not to be in contact with each other. This favorably prevents unintentional light emission (also referred to as crosstalk) from being caused by current flowing through two adjacent EL layers. As a result, the contrast can be increased to achieve a display device with high display quality.

The EL layer 686R, the EL layer 686G, and the EL layer 686B can be formed separately by a vacuum evaporation method or the like using a shadow mask such as a metal mask. These layers may be formed separately by a photolithography method. The use of the photolithography method achieves a display device with high resolution, which is difficult to obtain in the case of using a metal mask.

A protective layer 371 is provided over the conductor 688 so as to cover the light-emitting elements 570R, 570G, and 570B. The protective layer 371 has a function of preventing diffusion of impurities such as water into each light-emitting element from the above.

The protective layer 371 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 371. The protective layer 371 may be formed by an ALD method, a CVD method, or a sputtering method. Although the protective layer 371 includes an inorganic insulating film in this example, one embodiment of the present invention is not limited thereto. The protective layer 371 may have a stacked-layer structure of an inorganic insulating film and an organic insulating film, for example.

Figure 23C:
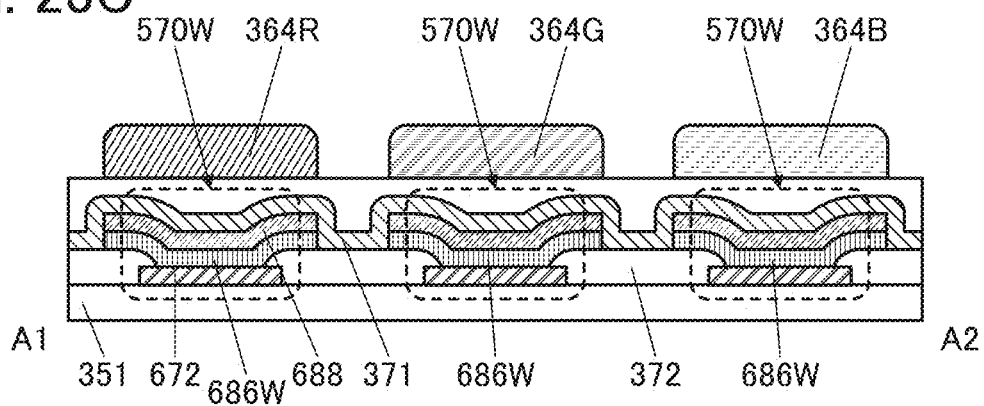

FIG. 23C illustrates an example different from the above.

In FIG. 23C, a light-emitting element 570W emitting white light is provided. The light-emitting element 570W includes an EL layer 686W emitting white light between the conductor 672 and the conductor 688.

The EL layer 686W can have, for example, a stacked structure of two or more layers that are selected so as to emit light of complementary colors. It is also possible to use a stacked EL layer in which a charge-generation layer is provided between light-emitting layers.

FIG. 23C shows three light-emitting elements 570W side by side. A coloring layer 364R is provided above the left light-emitting element 570W. The coloring layer 364R functions as a band path filter that transmits red light. Similarly, a coloring layer 364G that transmits green light is provided above the middle light-emitting element 570W, and a coloring layer 364B that transmits blue light is provided above the right light-emitting element 570W. This enables the display device to display color images.

The EL layer 686W and the conductor 688 are each separated between adjacent two light-emitting elements 570W. This favorably prevents unintentional light emission from being caused by current flowing through the EL layers 686W of adjacent two light-emitting elements 570W. Particularly when the EL layer 686W is a stacked EL element in which a charge-generation layer is provided between two light-emitting layers, the effect of crosstalk is more significant as the resolution increases, i.e., as the distance between adjacent pixels decreases, leading to lower contrast. Thus, the above structure can achieve a display device having high resolution and contrast.

The EL layer 686W and the conductor 688 are preferably separated by a photolithography method. This can reduce the distance between light-emitting elements, achieving a display device with higher aperture ratio than that is formed using, for example, a shadow mask such as a metal mask.

Note that in the case of a bottom-emission light-emitting element, the coloring layers may be provided between the conductor 672 and the substrate 351.

The above is the description of the light-emitting elements.

At least part of this embodiment can be implemented in appropriate combination with any of the other embodiments described in this specification.

Embodiment 4

In this embodiment, structure examples of an electronic device for which the display device of one embodiment of the present invention is used will be described.

The display device and the display module of one embodiment of the present invention can be applied to a display portion of an electronic device or the like having a display function. Examples of such an electronic device include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

In particular, the display device and the display module of one embodiment of the present invention can have a high resolution, and thus can be favorably used for an electronic device having a relatively small display portion. As the display device and the display module, a watch-type or bracelet-type information terminal device (wearable device); and a wearable device worn on a head, such as a device for VR such as a head mounted display and a glasses-type device for AR can be given, for example.

Figure 24A:
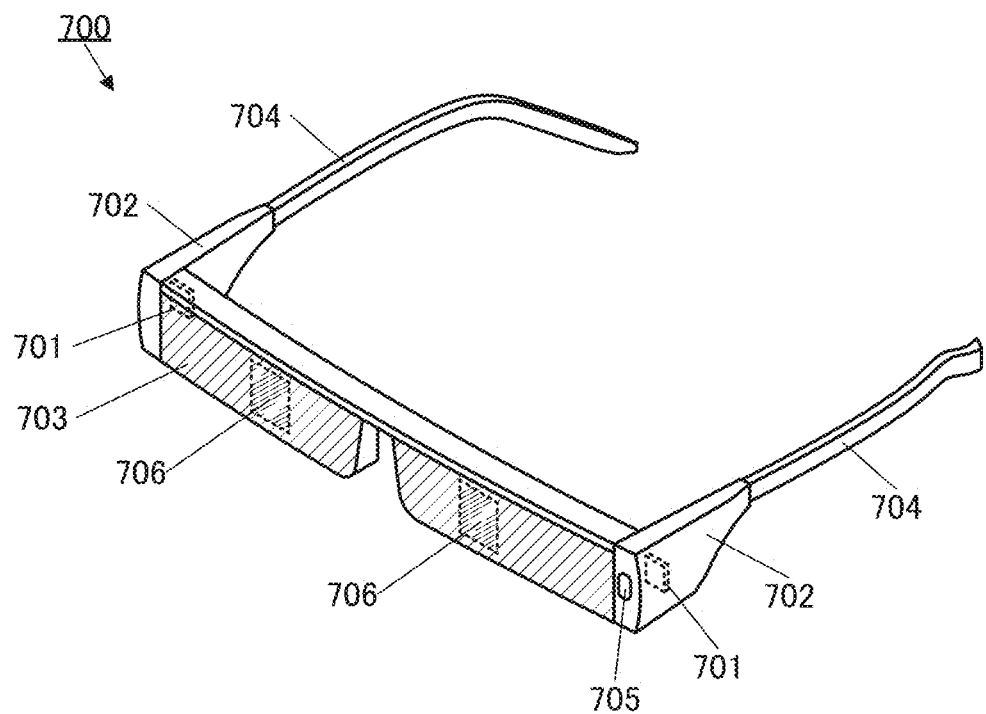
FIGS. 24A and 24B illustrate a structure example of an electronic device.

FIG. 24A is a perspective view of an electronic device 700 that is of a glasses type. The electronic device 700 includes a pair of display panels 701, a pair of housings 702, a pair of optical members 703, a pair of temples 704, and the like.

The electronic device 700 can project an image displayed on the display panel 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

The housing 702 includes a camera 705 capable of taking an image of what lies in front thereof. Although not illustrated, one of the housings 702 is provided with a wireless receiver or a connector to which a cable can be connected, whereby a video signal or the like can be supplied to the housing 702. Furthermore, when the housing 702 is provided with an acceleration sensor such as a gyroscope sensor, the orientation of the user's head can be detected and an image corresponding to the orientation can be displayed on the display region 706. Moreover, the housing 702 is preferably provided with a battery, in which case charging can be performed with or without a wire.

Next, a method for projecting an image on the display region 706 of the electronic device 700 is described with reference to FIG. 24B. The display panel 701, a lens 711, and a reflective plate 712 are provided in the housing 702. A reflective surface 713 functioning as a half mirror is provided in a portion corresponding to the display region 706 of the optical member 703.

Light 715 emitted from the display panel 701 passes through the lens 711 and is reflected by the reflective plate 712 to the optical member 703 side. In the optical member 703, the light 715 is fully reflected repeatedly by end surfaces of the optical member 703 and reaches the reflective surface 713, whereby an image is projected on the reflective surface 713. Accordingly, the user can see both the light 715 reflected by the reflective surface 713 and transmitted light 716 transmitted through the optical member 703 (including the reflective surface 713).

Figure 24B:
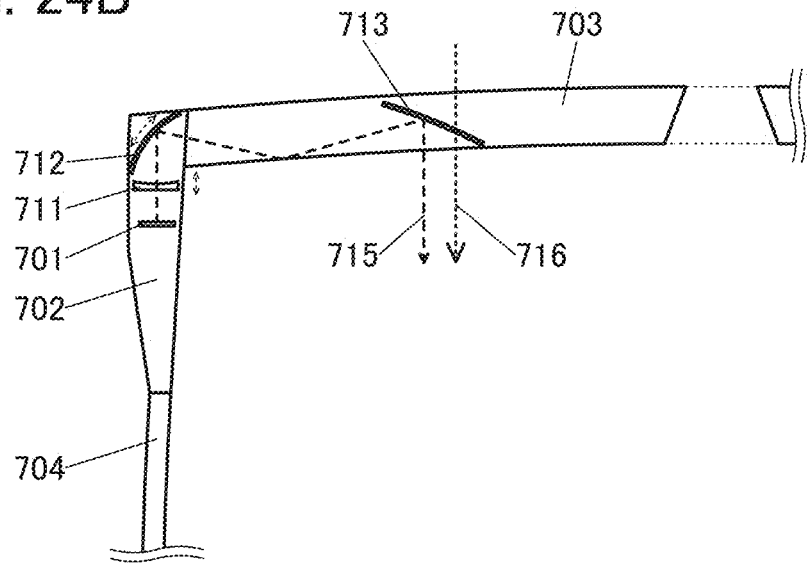

FIGS. 24A and 24B show an example in which the reflective plate 712 and the reflective surface 713 each have a curved surface. This can increase optical design flexibility and reduce the thickness of the optical member 703, compared to the case where they have flat surfaces. Note that the reflective plate 712 and the reflective surface 713 may be flat.

The reflective plate 712 can use a component having a mirror surface, and preferably has high reflectivity. As the reflective surface 713, a half mirror utilizing reflection of a metal film may be used, but the use of prism utilizing total reflection or the like can increase the transmittance of the transmitted light 716.

Here, the housing 702 preferably includes a mechanism for adjusting the distance or angle between the lens 711 and the display panel 701. This enables focus adjustment and zooming in/out of image. One or both of the lens 711 and the display panel 701 are preferably configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the most appropriate position in accordance with the position of the user's eye.

The display device or the display module of one embodiment of the present invention can be used for the display panel 701. Thus, the electronic device 700 can perform display with extremely high resolution.

Figure 25A:
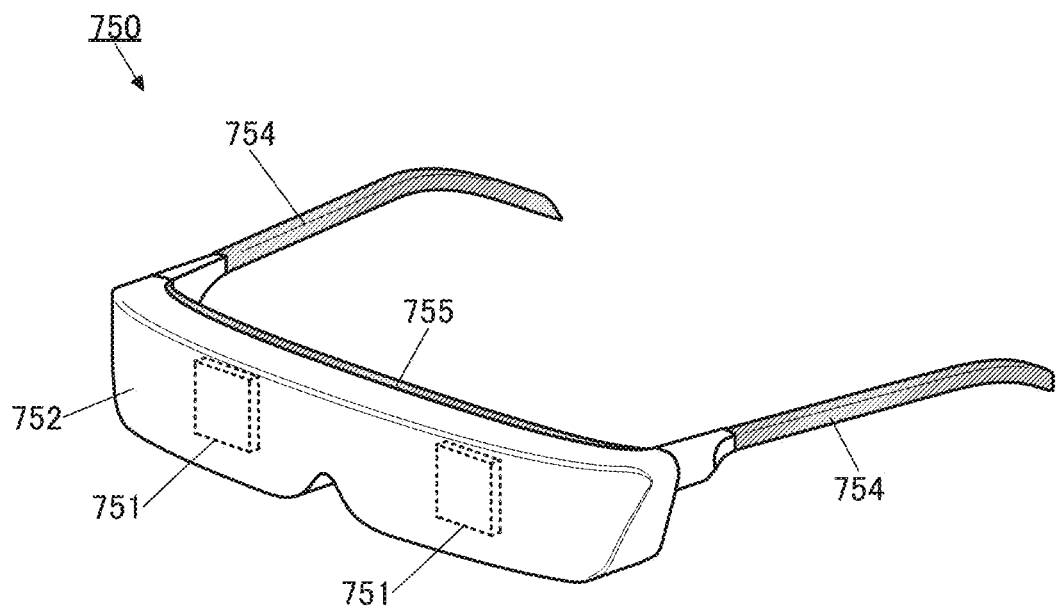
FIGS. 25A and 25B illustrate a structure example of an electronic device.
Figure 25B:
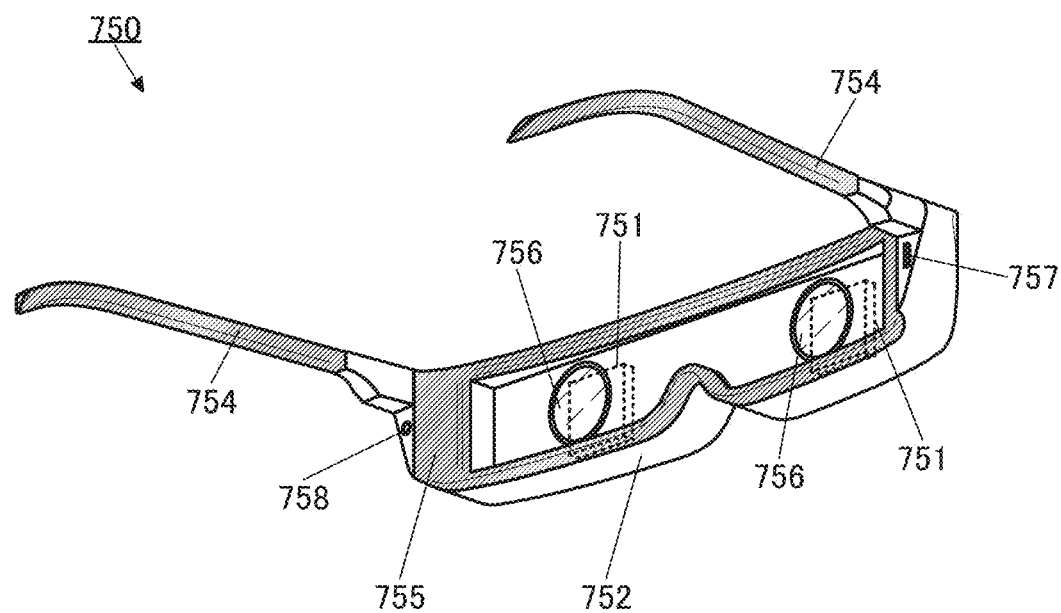

FIGS. 25A and 25B illustrate perspective views of an electronic device 750 that is of a goggle-type. FIG. 25A is a perspective view illustrating the front surface, the top surface, and the left side surface of the electronic device 750, and FIG. 25B is a perspective view illustrating the back surface, the bottom surface, and the right side surface of the electronic device 750.

The electronic device 750 includes a pair of display panels 751, a housing 752, a pair of temples 754, a cushion 755, a pair of lenses 756, and the like. The pair of display panels 751 is positioned to be seen through the lenses 756 inside the housing 752.

The electronic device 750 is an electronic device for VR. A user wearing the electronic device 750 can see an image displayed on the display panel 751 through the lens 756. Furthermore, when the pair of display panels 751 displays different images, three-dimensional display using parallax can be performed.

An input terminal 757 and an output terminal 758 are provided on the back side of the housing 752. To the input terminal 757, a cable for supplying a video signal from a video output device or the like, power for charging a battery provided in the housing 752, or the like can be connected. The output terminal 758 can function as, for example, an audio output terminal to which earphones, headphones, or the like can be connected. Note that in the case where audio data can be output by wireless communication or sound is output from an external video output device, the audio output terminal is not necessarily provided.

In addition, the housing 752 preferably includes a mechanism by which the left and right positions of the lens 756 and the display panel 751 can be adjusted to the optimal positions in accordance with the position of the user's eye. In addition, the housing 752 preferably includes a mechanism for adjusting focus by changing the distance between the lens 756 and the display panel 751.

The display device or the display module of one embodiment of the present invention can be used for the display panel 751. Thus, the electronic device 750 can perform display with extremely high resolution. This enables a user to feel high sense of immersion.

The cushion 755 is a portion in contact with the user's face (forehead, cheek, or the like). The cushion 755 is in close contact with the user's face, so that light leakage can be prevented, which increases the sense of immersion. A soft material is preferably used for the cushion 755 so that the cushion 755 is in close contact with the face of the user wearing the electronic device 750. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 755, whereby light leakage can be suitably prevented. Furthermore, using such a material is preferable because it has a soft texture and the user does not feel cold when wearing the device in a cold season, for example. The member in contact with user's skin, such as the cushion 755 or the temple 754, is preferably detachable because cleaning or replacement can be easily performed.

At least part of this embodiment can be implemented in combination with any of the other embodiments described in this specification as appropriate.

Example

In this example, a display device of one embodiment of the present invention was fabricated. The display device 10F illustrated in FIG. 9A in Embodiment 1 can be referred to for a pixel of the fabricated display device. FIG. 13 can be referred to for cross sectional structures of a transistor and a display element of the fabricated display device.

Figure 26:
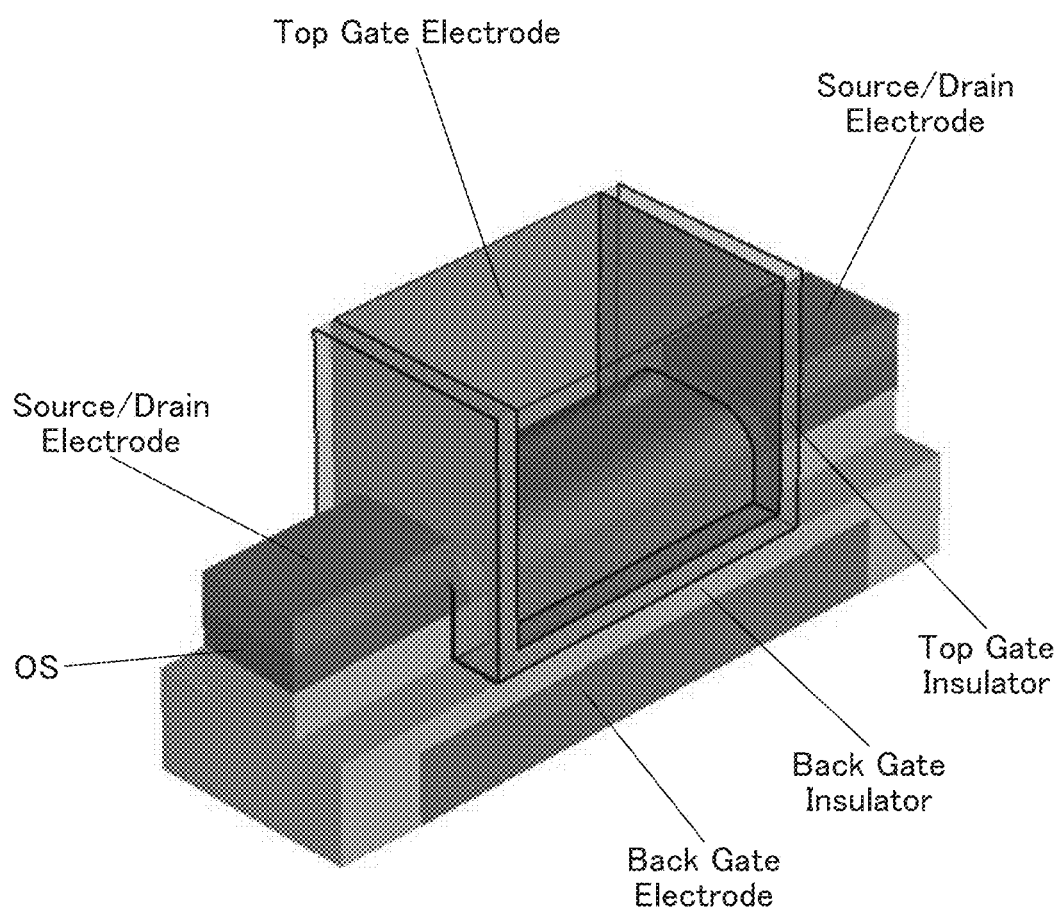
FIG. 26 illustrates a structure example of a transistor of Example.

First, the electrical characteristics of the transistor used in the display device are described. FIG. 26 illustrates a schematic perspective view of the transistor. The fabricated transistor has a trench-gate self-aligned (TGSA) structure formed with an LSI process node, in which a top gate electrode is formed to cover a channel of an oxide semiconductor (OS). Therefore, electric-field controllability by the top gate electrode is improved, and thus the structure is suitable for miniaturization.

The transistor is a transistor in which an oxide semiconductor is used as a semiconductor where a channel is formed (OS transistor). The measured transistor has a channel length of approximately 200 nm and a channel width of approximately 60 nm.

Figure 27A:
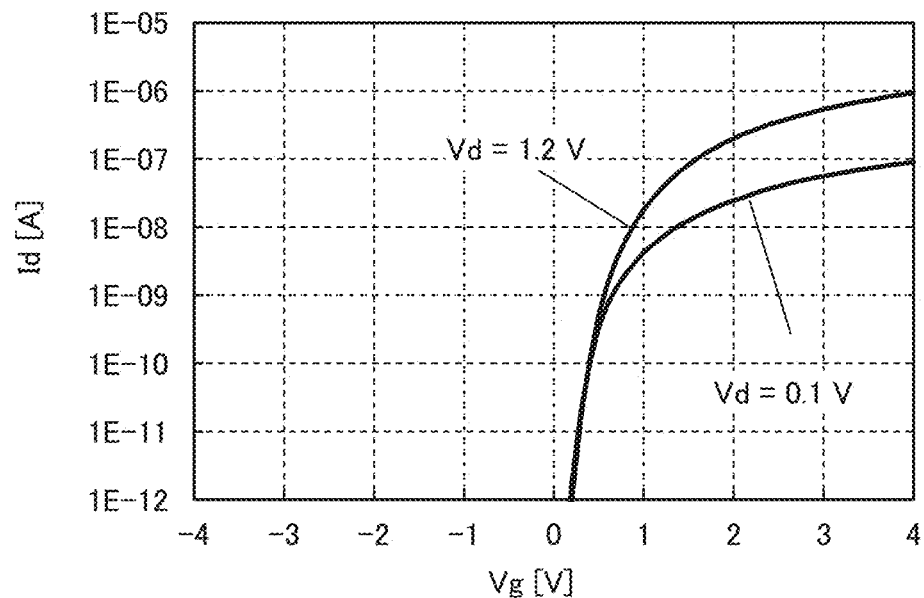
FIGS. 27A and 27B show electrical characteristics of the transistor of Example.

FIG. 27A shows Id-Vg characteristics. FIG. 27A shows two Id-Vg characteristics at drain voltages of 0.1 V and 1.2 V. In spite of being minute, the transistor exhibited normally-off characteristics as shown in FIG. 27A and its off-state current was lower than or equal to the lower detection limit ($1 \times 10^{12}$ A) of the measurement device.

Figure 27B:
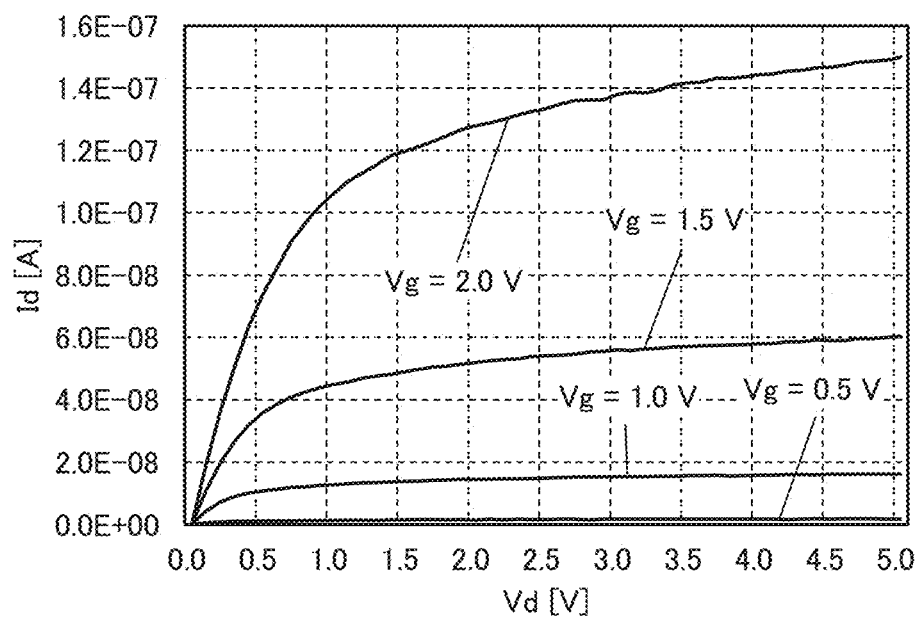

FIG. 27B shows Id-Vd characteristics. FIG. 27B shows four Id-Vd characteristics at gate voltages of 0.5 V, 1.0 V, 1.5 V, and 2.0 V. In spite of being minute, the transistor exhibited high saturation as shown in FIG. 27B.

Figure 28:
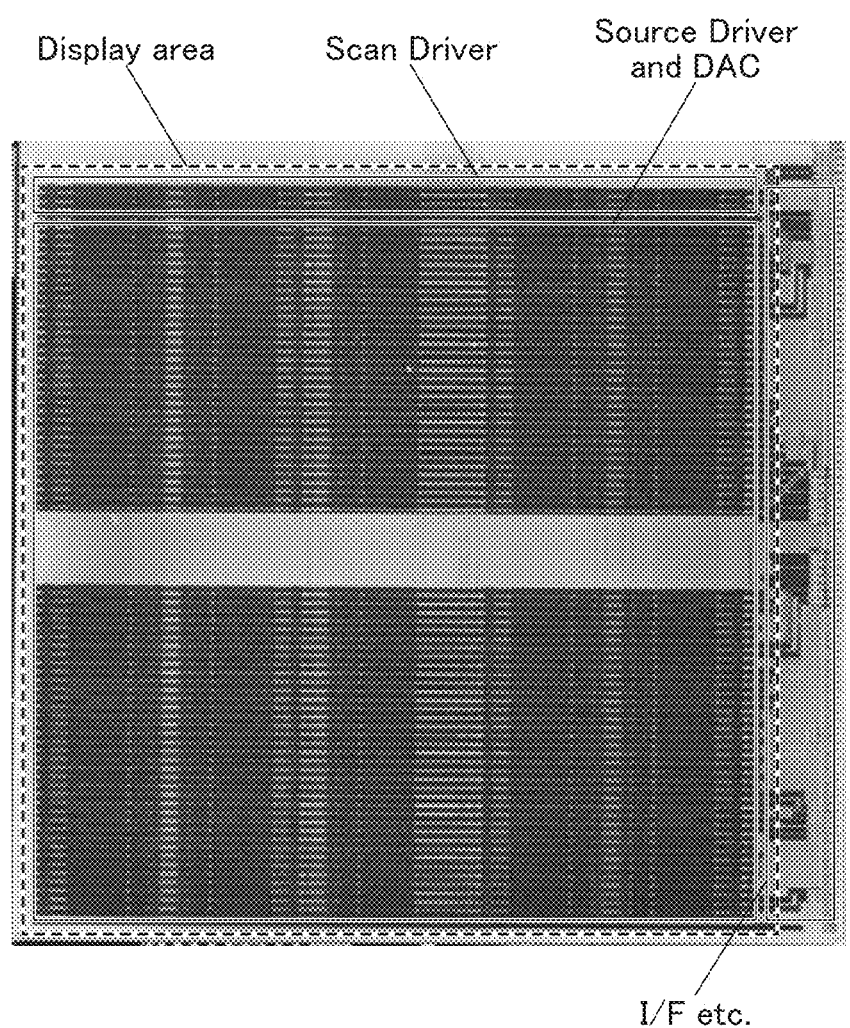
FIG. 28 is an optical micrograph of a display panel of Example in a manufacturing step.

The fabricated display panel had a structure in which silicon transistors, OS transistors, and OLED elements were stacked. FIG. 28 is an optical micrograph of a chip at a stage after a formation step of the silicon transistors. It can be found that a source driver, a digital-to-analog converter (DAC), a scan driver, an interface (IF), and the like are provided in a display region denoted by dashed lines. With a monolithic structure in which the silicon transistors, the OS transistors, and the OLED elements are stacked in this manner, a frame area can be reduced.

The specifications of the fabricated panel are described. The size of the display region was a diagonal of 0.51 inches, the resolution was 1920×1920 pixels, the pixel size was 4.8 µm, the pixel density was 5291 ppi, the aperture ratio was 23.8%, and a color method with white tandem OLEDs and color filters was used. The light-emitting elements were top-emission light-emitting elements.

Since white tandem elements are used as OLED elements, high voltage is required as compared with the case of using single elements. OS transistors with high withstand voltage are used as transistors of pixels in the display device of this example, and therefore, favorable display is possible with the white tandem elements.

Figure 29:
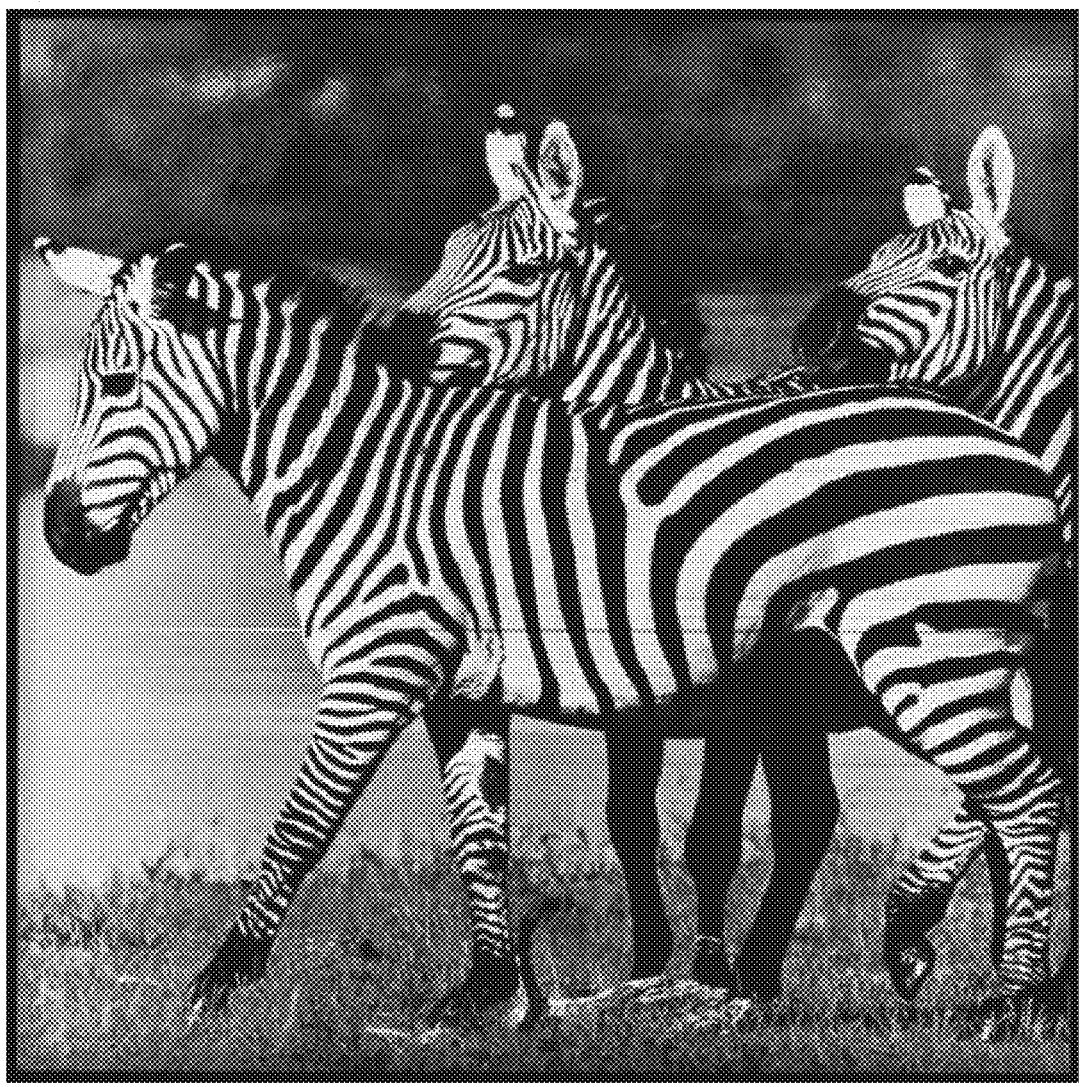
FIG. 29 is a photograph of the display panel of Example that is displaying an image.

FIG. 29 is a photograph of the display device displaying an image. As shown in FIG. 29, favorable display was performed. It was also confirmed that the display device was capable of duty driving.

This application is based on Japanese Patent Application Serial No. 2020-214950 filed with Japan Patent Office on Dec. 24, 2020 and Japanese Patent Application Serial No. 2021-158140 filed with Japan Patent Office on Sep. 28, 2021, the entire contents of which are hereby incorporated by reference.

What is claimed is:

1. A display device comprising:
   a first transistor;
   a second transistor;
   a first wiring configured to be supplied with a source signal;
   a second wiring configured to be supplied with a gate signal;
   a third wiring configured to be supplied with a constant potential; and
   a pixel electrode, wherein one of a source and a drain of the first transistor is electrically connected to the first wiring, wherein a gate of the first transistor is electrically connected to the second wiring, wherein one of a source and a drain of the second transistor is electrically connected to the pixel electrode, wherein the other of the source and the drain of the second transistor is electrically connected to the third wiring, wherein the first wiring extends in a first direction, wherein the second wiring extends in a second direction, wherein the second direction is a direction intersecting the first direction, wherein the first wiring and the pixel electrode overlap each other with the third wiring therebetween, and wherein each of the first transistor and the second transistor comprises a semiconductor layer in which current flows in the same direction.

2. The display device according to claim 1, wherein each of the first transistor and the second transistor comprises a semiconductor layer in which current flows in the first direction.

3. The display device according to claim 1, wherein each of the first transistor and the second transistor comprises a semiconductor layer in which current flows in the second direction.

4. The display device according to claim 1, further comprising a plurality of dummy layers,
wherein the first transistor comprises a semiconductor layer,
wherein each of the plurality of dummy layers comprises a semiconductor material same as the semiconductor layer of the first transistor,
wherein each of the plurality of dummy layers comprises a portion having substantially the same top surface shape as the semiconductor layer of the first transistor, and
wherein the plurality of dummy layers and the semiconductor layer are arranged at a regular interval in the second direction.

5. The display device according to claim 1, further comprising a plurality of dummy layers,
wherein the first transistor comprises a semiconductor layer,
wherein each of the plurality of dummy layers comprises a semiconductor material same as the semiconductor layer of the first transistor,
wherein each of the plurality of dummy layers comprises a portion having substantially the same top surface shape as the semiconductor layer of the first transistor, and
wherein the plurality of dummy layers and the semiconductor layer are arranged at a regular interval in the first direction.

6. The display device according to claim 1, further comprising:
a fourth wiring;
a third transistor; and
a fourth transistor,
wherein one of a source and a drain of the third transistor is electrically connected to the fourth wiring,
wherein the other of the source and the drain of the third transistor is electrically connected to a gate of the second transistor,
wherein one of a source and a drain of the fourth transistor is electrically connected to the fourth wiring, wherein the other of the source and the drain of the fourth transistor is electrically connected to the pixel electrode, wherein the third wiring is supplied with a first potential, wherein the fourth wiring is supplied with a second potential, and wherein the second potential is lower than the first potential.

7. The display device according to claim 1, further comprising a third transistor,
wherein the third transistor comprises silicon in a channel formation region,
wherein the first transistor comprises indium or zinc, or both indium and zinc in a channel formation region, and
wherein each of the first transistor and the second transistor is positioned over the third transistor.

8. The display device according to claim 1,
wherein the third wiring has a top surface shape in a form of lattice,
wherein the third wiring comprises a first portion extending in the first direction and a second portion extending in the second direction, and
wherein the pixel electrode and the first wiring overlap each other with the first portion therebetween.

9. The display device according to claim 1, further comprising a plurality of light-emitting regions,
wherein one of the plurality of light-emitting regions is surrounded by six of the plurality of light-emitting regions in a plan view.

10. The display device according to claim 9,
wherein the one of the plurality of light-emitting regions has a hexagonal shape in the plan view,
wherein each of two interior angles of the hexagonal shape is larger than 120°,
wherein each of the other four interior angles of the hexagonal shape is smaller than 120°, and
wherein the two interior angles are positioned at the opposite corners to each other.

11. The display device according to claim 9,
wherein the one of the plurality of light-emitting regions has a hexagonal shape in the plan view, and
wherein each of two interior angles of the hexagonal shape is larger than 120°.

12. The display device according to claim 9,
wherein the plurality of light-emitting regions comprises adjacent three light-emitting regions, and
wherein the adjacent three light-emitting regions are positioned to be on vertices of an isosceles triangle.

13. A display module comprising:
the display device according to claim 1; and
a connector or an integrated circuit.

14. An electronic device comprising:
the display module according to claim 13; and
at least one of an antenna, a battery, a housing, a camera, a speaker, a microphone, a touch sensor and an operation button.

15. A display device comprising:
a first wiring configured to be supplied with a source signal;
a second wiring configured to be supplied with a gate signal;
a third wiring configured to be supplied with a constant potential; and
a pixel electrode,
wherein the first wiring extends in a first direction,
wherein the second wiring extends in a second direction, wherein the second direction is a direction intersecting the first direction, wherein the first wiring and the pixel electrode overlap each other with the third wiring therebetween, wherein the third wiring has a top surface shape in a form of lattice, wherein the third wiring comprises a first portion extending in the first direction and a second portion extending in the second direction, and wherein the pixel electrode and the first wiring overlap each other with the first portion therebetween.

16. The display device according to claim 15, further comprising a first transistor and a second transistor, wherein one of a source and a drain of the first transistor is electrically connected to the first wiring, wherein a gate of the first transistor is electrically connected to the second wiring, wherein one of a source and a drain of the second transistor is electrically connected to the pixel electrode, wherein the other of the source and the drain of the second transistor is electrically connected to the third wiring.

17. The display device according to claim 16, further comprising a plurality of dummy layers, wherein the first transistor comprises a semiconductor layer, wherein each of the plurality of dummy layers comprises a semiconductor material same as the semiconductor layer of the first transistor, wherein each of the plurality of dummy layers comprises a portion having substantially the same top surface shape as the semiconductor layer of the first transistor, and wherein the plurality of dummy layers and the semiconductor layer are arranged at a regular interval in the second direction.

18. A display module comprising:
the display device according to claim 15; and
a connector or an integrated circuit.

19. An electronic device comprising:
the display module according to claim 18; and
at least one of an antenna, a battery, a housing, a camera, a speaker, a microphone, a touch sensor and an operation button.

* * * * *